US005929194A

United States Patent [19]

Woo et al.

[11] Patent Number: 5,929,194
[45] Date of Patent: Jul. 27, 1999

[54] CROSSLINKABLE OR CHAIN EXTENDABLE POLYARYLPOLYAMINES AND FILMS THEREOF

[75] Inventors: Edmund P. Woo; Michael Inbasekaran, both of Midland; William R. Shiang, Sanford; Gordon R. Roof, Midland, all of Mich.

[73] Assignee: The Dow Chemical Company, Midland, Mich.

[21] Appl. No.: 08/967,348

[22] Filed: Oct. 27, 1997

Related U.S. Application Data

[63] Continuation of application No. 08/606,180, Feb. 23, 1996, abandoned.

[51] Int. Cl.$^6$ ............................ C08G 12/00; C08G 69/26; C08G 73/00
[52] U.S. Cl. ............................ 528/229; 528/38; 528/348; 528/422
[58] Field of Search ............................... 528/38, 229, 348, 528/422

[56] References Cited

U.S. PATENT DOCUMENTS

| | | | |
|---|---|---|---|
| 3,995,299 | 11/1976 | Partridge . | |
| 4,356,429 | 10/1982 | Tang . | |
| 4,525,256 | 6/1985 | Martin . | |
| 4,528,366 | 7/1985 | Woo et al. | 528/422 |
| 4,539,507 | 9/1985 | VanSlyke et al. | 252/511 |
| 4,720,432 | 1/1988 | VanSlyke et al. | 428/457 |
| 4,769,292 | 9/1988 | Tang et al. . | |
| 4,885,211 | 12/1989 | Tang et al. . | |
| 4,952,667 | 8/1990 | Shikatani et al. . | |
| 5,047,687 | 9/1991 | VanSlyke . | |
| 5,059,862 | 10/1991 | VanSlyke et al. . | |
| 5,061,569 | 10/1991 | VanSlyke et al. . | |
| 5,247,190 | 9/1993 | Friend et al. | 257/40 |
| 5,256,945 | 10/1993 | Imai et al. . | |
| 5,352,554 | 10/1994 | Mishima et al. | 430/59 |
| 5,352,834 | 10/1994 | Morishita et al. | 430/59 |
| 5,356,743 | 10/1994 | Yanus et al. . | |
| 5,639,914 | 6/1997 | Tomiyama et al. | 564/309 |

FOREIGN PATENT DOCUMENTS

| | | |
|---|---|---|
| 0372979 | 6/1990 | European Pat. Off. . |
| 372979 | 6/1990 | European Pat. Off. . |
| 387715 A2 | 9/1990 | European Pat. Off. . |
| 443861 A2 | 8/1991 | European Pat. Off. . |
| 0 517 542 A1 | 12/1992 | European Pat. Off. . |
| 637899 A1 | 2/1995 | European Pat. Off. . |
| 0 710 893 A1 | 5/1996 | European Pat. Off. . |
| 0 721 935 A1 | 7/1996 | European Pat. Off. . |
| 5311163 | 11/1993 | Japan . |
| 95/09147 | 4/1995 | WIPO . |
| 97/09394 | 3/1997 | WIPO . |

OTHER PUBLICATIONS

J. Chem. Soc. (C), 1970, pp. 488–492, I.G.C. Coutts et al, "Organs–boron Compounds, Part IIIk, Aliphatic & Aromatic Diboronic Acids".

Bulletin of the Chemical Society of Japan, vol. 51(7), pp. 2091–2097, Iakakaz, Yamamoto et al., A novel type of Polycondensation utilizing Transition metal catalyzed C–C Coupling I. Preparation of Thermostable Poly–phenyleno Type Polymers.

ACS, 1991, Thomas I. Wallow et al., pp. 7411–7412, "In Aqua Synthesis of Water–Soluble Poly(phenylene) Derivatives".

Letters to Nature, pp. 539–541, J.A. Burroughes et al., "Light–emitting Diodes based on Conjugated Polymers".

Synthetic Communications, 11(7), pp. 513–519, (1981), N. Miyaura et al., "The Palladium –Catalyzed Cross–Coupling Reaction of Phenylboronic Acid with Haloarenes in the presence of Bases".

Prog. Polym. Sci. vol. 17, pp. 1153–1205, 1992, Takakazu Yamamoto "Electronically Conducting & Thermally Stable The–Conjugated Polyl arylenes prepared by Organometallic Processes".

Bull. Chem. Soc. Jpn., 63, pp. 80–87, 1990, Masahitio Igota et al., "Homo coupling of arylhalides Using Nickel(II) Complex and Zinc in the Presence of EtyNI. An Efficient Method for the Synthesis of Bipyridines", Jul. 18, 1989.

ACS Symposium Series 367, "Cross–linked Polymers, Chemistry, Properties & Applications " Carduner et al, pp. 380—394m Carbon–13 NMR Investigation of Oligomerization of Bismaleimidophenyl Methane w/Diallyl Bisplanol A, 1988.

PCS, Polymer Preprints, vol. 34, No. 1, 1993, pp. 413–414, "Perfluorocyclo–butane aromatic ether polymers," Davis A. Babb et al.

ACS, Polymers Preprints, vol. 53, No. 1, 1992 M.T. Bishop et al "AB–BCB–Maleimide Resins for High Temperature Composites".

Amerian Institute of Physics, 1990, pp. 799–801, "Blue light–emitting organic electro lumiescent devices", Chihaya Adachi et al.

J. Phys. Chem., 1984, 88, pp. 4714–4717, D.M. Pai et al, "Trap–controlled Hopping Transport".

(List continued on next page.)

*Primary Examiner*—P. Hampton-Hightower
*Attorney, Agent, or Firm*—Ann K. Galbraith

[57] ABSTRACT

The invention relates to poly(tertiary di- or polyarylamines) which have more than one aryl moiety which is further substituted with a moiety capable of chain extension or crosslinking. In another aspect, the invention relates to poly(tertiary di- or polyarylamines) which have more than one aryl moiety which is further substituted with a moiety capable of chain extension or crosslinking which are partially or completely crosslinked or chain extended. The invention further relates to films prepared from such chain extended or crosslinked poly(tertiary di- or polyarylamines). The invention further relates to electrophotographic devices and electroluminescent devices, such as polymeric light-emitting diodes, containing such films.

16 Claims, No Drawings

OTHER PUBLICATIONS

Advanced Materials, 1993, Wataru Ishikawa et al, Novel Amor–phous Molecular Materials: The Starburst Molecular 1,3,5–TriszN–(4–diphenyl–aminophenyl)phenylamino 1 benzene, pp. 559–561, vol. 5, No. 718.

Advanced Materials, 1994, vol. 6, No. 9, Y Kumabara et al, "Thermally stable Multi layered Organic Electroluminescent Devices Using Novel Starburst Molecules, 4,4', 4"–Tri (N–carbazolul)triphenyl–amino (TCTA) and 4,4',4", –Tris (3–methylphenyl phenyl–amino) triplenylamino (M–MT-DATA), as Hole–Transport Materials".

Synthetic Materials, 40 (1991) pp. 231–238, M. Ishkikawa et al, Synthesis & properties of electroncially conducting polytriphenyl–aminos.

Appl. Phys. Lett. 51(12), pp. 913–915, "Organic electroluminescent diodes", C.N. Tang et al, Sep. 21, 1987.

Appl. Phys. Lett. 61(A), pp. 761–763, "Organic electroluminescent devices based on molecularly coped polymers" J. Kido et al, Aug. 17, 1992.

Encyclopedia of Polymer Science & Engineering, vol. 11, pp. 186–196, "Photopolymerization" H.F. Mark et al, 1988.

"Reactive Oligomers", Frank W. Harris et al, "High Temperature Polymers from Thermally Curable Oligomers", pp. 1–16, Chapter 1, Chapter 8, pp. 91–103, Apr. 8–13, 1984.

J. Org. Chem., 1986, 51, pp. 2627–2637, Ismael Colon et al, "Coupling of Aryl Chlorides by Hidel and Reducing Metals."

Journal of Polymer Science: Part A, Polymer–Chemistry, vol. 28, pp. 367–383, I. Colon et al, "High Molecular Weight Aromatic Polymers by Nickel Coupling of Aryl Polychlorides", 1990.

Kawamura et al., Chemical Abstracts, vol. 125, Abstract 234547 (1996).

Li et al., Chemcial Abstracts, vol. 127, Abstract 101179 (1997).

Mihara et al., Chemical Abstracts, vol. 123, Abstract 183676 (1995).

Muto et al., Chemical Abstracts, vol. 111, Abstract 184162 (1989).

Shimada et al., Chemical Abstracts, vol. 115, Abstract 194199 (1991).

Tamano et al., Chemical Abstracts, vol. 127, Abstract 115061 (1997).

Tamoto et al., Chemical Abstracts, vol. 123, Abstract 183055 (1995).

Tamoto et al., Chemical Abstracts, vol. 123, Abstract 285572 (1995).

Tomiyama et al., Chemical Abstracts, vol. 123, Abstract 183664 )1005).

Umeda et al., Chemical Abstracts, vol. 123, Abstract 22137 (1995).

Adachi, Chihaya et al., "Confinement of Charge Carriers and Molecular Excitons within 5–nm–thick Emitter Layer in Organic Electroluminescent Devices with a Double Heterostructure", Appl. Phys. Letter, vol. 57, No. 6, pp. 531–533 (Aug. 6, 1990).

Baker, Nelson T. III, et al., "Electrophillic Substitution Reactions of Triphenylamine", Journal of Organic Chemistry, vol. 30, pp. 3714–3718 (Nov. 1965).

Davis, M. J. et al., "The UV–Curing Behaviour of Some Photoinitiators and Photoactivators", J. Oil Col. Chem. Assoc., vol. 61, pp. 256–263 (1978).

Gautier, Sylvie et al., "Phase–Transfer Catalysis in the Ullmann Synthesis of Substituted Triphenylamines", Synthesis, pp. 383–385 (Apr. 1987).

Guram, Aril S. et al., "A Simple Catalytic Method for the Conversion of Aryl Bromides to Arylamines", Angew. Chem. Int. Ed. Engl., vol. 34, No. 12, pp. 1348–1350 (1995).

Kohler, E.P. et al., "An Apparatus for Determining Both the Quality of Gas Evolved and the Amount of Reagent Consumed in Reactions with Methyl Magnesium Iodide", Journal of the American Chemical Society, vol. 49, pp. 3181–3188 (Dec. 1927).

Walter, Robert I., "Triarylaminium Salt Free Radicals", Journal of the American Chemical Society, vol. 77, pp. 5999–6002 (Nov. 20, 1995).

Chemical Abstract 91–069941/10 (1991).

Chemical Abstract 91–069927/10 (1991).

Chemical Abstract 93–365193/46 (1993).

Derwent 97–359265/199733 (JP 915137 A).

CROSSLINKABLE OR CHAIN EXTENDABLE POLYARYLPOLYAMINES AND FILMS THEREOF

CROSS-REFERENCE TO RELATED APPLICATION

This is a continuation of application Ser. No. 08/606,180 filed Feb. 23, 1996 now abandoned.

BACKGROUND OF THE INVENTION

This invention relates to crosslinkable or chain extendable polyarylpolyamines, methods for the preparation of such crosslinkable or chain extendable polyarylpolyamines and films thereof. The films of the polyarylpolyamines are useful as charge transport layers in light-emitting diodes.

Triarylamines, as evidenced by their low oxidation potentials, are easily oxidized to the corresponding radical cations. The cations are equally easily reduced to the neutral starting amines. This oxidation/reduction process is reversible and can be repeated many times. For this reason, triarylamines are widely used as charge transport materials specifically for the transport of holes (positive charges).

Charge transport materials are essential to the efficient operation of electrophotographic devices (copying machines and printers) and electroluminescent devices such as light-emitting diodes. In both applications, the triarylamines are used in film form. For electrophotographic applications, a triarylamine and a polymeric binder are dissolved in a suitable solvent and the resulting solution used for coating, see U.S. Pat. Nos. 5,352,554 and 5,352,834. Polycarbonates, polystyrene, poly(vinylcarbazole), poly(vinylbutyral) and poly(methyl methacrylate) are some of the polymers used as binders. To obtain a film of useful charge transport properties, the loading of triarylamine in the final formulation must be as high as possible, preferably more than 30 percent of the total formulation with 50 percent by weight loading levels common. In low concentrations, the triarylamine will act to trap charge carriers instead of transporting them, D. M. Pai, J. F. Yanus, M. Stolka., *J. Phys. Chem.*, Vol. 88, p. 4714 (1984). The triarylamine compound must be soluble in high concentrations in the binder polymer after the film is formed and the solvent is removed. If the triarylamine compound separates out from the polymer binder or crystallizes into a fine dispersion of crystals in the polymer binder, the film can no longer serve its intended purpose.

Organic electroluminescent devices are typically constructed by sandwiching an organic film or a stack of organic films between an anode and a cathode such that when voltage is applied, holes and electrons are injected and transported into the device. The combination of holes and electrons within the organic layer leads to excitons which can undergo radiative decay to the ground state, emitting the excitation energy in the form of light. For the light to be seen, it is necessary that one of the electrodes be transparent. Mixed metal oxides, particularly indium tin oxides (ITO), form smooth, conducting, transparent films and are most commonly selected as the anode material. In practice, a sheet of ITO-coated glass is used as the substrate and onto the ITO side is deposited an organic film, and onto this film is deposited a second metal as the cathode. The cathode material is a metal of lower work function than ITO. Metals such as calcium, magnesium, indium and aluminum are used. A major improvement in device efficiency was achieved when a film of a triarylamine was deposited by conventional vapor-phase deposition between the emitting film and the anode, see C. W. Tang, S. A. Van Slyke, *Appl. Phys. Lett.*, Vol. 51, p. 913 (1987), and U.S. Pat. No. 4,539,507. One of the problems associated with devices of this type is the tendency of the organic films to crystallize due to the heat evolved during operation, see C. Adachi, T. Tsutsui, S. Saito, *Appl. Phys. Lett.*, Vol. 56, p. 799 (1990). Contacts between organic layers and electrodes may be destroyed by crystallization, leading to device failure, see J. Kido, M. Kohda, Appl. Phys. Lett., Vol. 61, p. 761 (1992).

European Patent Application 372 979 teaches hole-transporting polymers of the structure

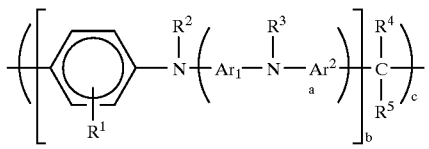

prepared from the reaction of aldehydes and aromatic amines. These polymers are freely soluble in common organic solvents.

Copolymers consisting of aromatic amide and triarylamine groups have been claimed as hole-transporting layers in electroluminescent devices, see Japanese Patent 0531163-A. These copolymers are less desirable for use in electroluminescent devices as the concentration of the active triarylamine groups are depressed by the presence of the amide comonomer.

Burroughes et al. disclosed that an organic polymer can be used as the emitting layer, see J. B. Burroughes, D. D. C. Bradley, A. R. Brown, R. N. Marks, K. Mackay, R. H. Friend, P. L. Burns, A. B. Holmes, Nature, Vol. 347, p. 539 (1990) and U.S. Pat. No. 5,247,190. Since polymer films can be formed on substrates by a variety of solution coating techniques, and they are much more robust mechanically than vapor-deposited films of small molecules, this discovery is seen as enabling the development of large-area displays.

To construct an electroluminescent device from a polymer film, it would be advantageous to have available hole-transporting materials that can be crosslinked to solvent-resistant polymer films so that a second polymer film can be applied in the form of a solution without affecting the integrity of the first polymer film.

EP 0637899 discloses an electroluminescing arrangement containing one or more organic layers, characterized by at least one of the layers being obtained by thermal or radiation-induced crosslinking and by the fact that it contains at least one charge-transporting compound per layer. Disclosed are known, relatively low molecular weight, charge-transporting compounds which carry anionically, cationically or radically polymerizable groups. Among the known charge-transporting compounds are tertiary aromatic amines, oxadiazoles, thiadiazoles, benzoxazoles, benzotriazoles, phthalocyanines, condensed aromatic systems such as perylenes, pyrenes or coronenes or polyene compounds. Radically polymerizable groups disclosed are vinyl carbonyl compounds such as acrylates, methacrylates or maleic acid derivatives. Cationically polymerizable groups are groups which react with protic acids or Lewis acids to form polymers and include vinyl ether and epoxide groups. Anionically polymerizable groups include cyanoacrylate, methacrylate or styrene. The compounds disclosed require large amounts of energy to result in excitation sufficient to cause light emission, that is, from 87 to 93 volts.

What is needed are relatively high molecular weight charge transport compounds which are capable of forming films and can be crosslinked by conventional methods, such as by radiation or heat-curing, to form solvent resistant films. What is needed are such compounds which can form such films that can maintain their integrity when exposed to a solution of another organic polymer. What is also needed are such compounds which do not require high energy input levels to emit light. What is also needed are polymeric light-emitting diode devices prepared from such films. What is also needed are processes for the preparation of such compounds.

SUMMARY OF THE INVENTION

The invention relates to poly(tertiary di- or polyarylamines) further substituted with, on average, more than one aryl moiety which is further substituted with a moiety capable of chain extension or crosslinking. In another aspect, the invention relates to poly(tertiary di- or polyarylamines) further substituted with, on average, more than one aryl moiety which is further substituted with a moiety capable of chain extension or crosslinking, which are partially or completely crosslinked or chain extended. The invention further relates to films prepared from such chain extended or crosslinked poly(tertiary di- or polyarylamines). The invention further relates to electrophotographic devices and electroluminescent devices containing such films, such as polymeric light-emitting diodes.

The invention also relates to processes for the preparation of poly(tertiary- di- or polyarylamines) which are substituted with, on average, more than one aryl moiety which is further substituted with a moiety capable of chain extension or crosslinking. One such process comprises contacting one or more tertiary di- or polyarylamines having about two halogen substituents with a haloaromatic compound having a reactive group capable of crosslinking or chain extension or a trialkylsiloxy moiety in the presence of a catalytic amount of a divalent nickel salt, at least a stoichiometric amount of zinc powder, a trihydrocarbylphosphine and an amount of a compound capable of accelerating the reaction in a polar solvent, and an optional co-solvent comprising an aromatic hydrocarbon or ether, under conditions such that one or more poly(tertiary di- or polyarylamines) are substituted with, on average, more than one aryl moiety which is further substituted with a moiety capable of chain extension or crosslinking are prepared.

Another process comprises contacting one or more tertiary di- or polyarylamines having about two halogen substituents with an aromatic boronic acid or ester having a reactive group capable of crosslinking or chain extension or a trialkylsiloxy moiety in the presence of a catalytic amount of a zero valent palladium catalyst in the presence of heat and a base under conditions such that one or more poly(tertiary di- or polyarylamines) which are substituted with, on average, more than one aryl moiety which is further substituted with a moiety capable of chain extension or crosslinking or a trialkylsiloxy moiety are prepared.

The polymers of the invention form films which are efficient in the transport of positive charges when exposed to relatively low voltage levels. The films can be crosslinked to form solvent-resistant films. The processes disclosed herein provide efficient means of preparing the disclosed compounds.

DETAILED DESCRIPTION OF THE INVENTION

In a preferred embodiment, the poly(tertiary di- or polyarylamines) of the invention correspond to one or both of Formulas (I) or (II).

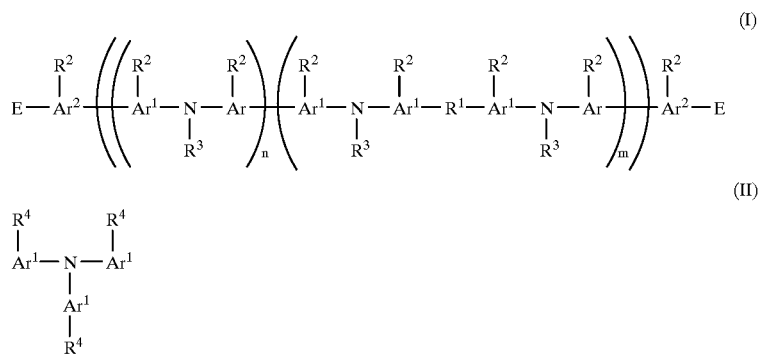

$Ar^1$ and $Ar^2$ are independently in each occurrence a di- or multivalent $C_{6-18}$ aryl moiety or a di- or multivalent $C_{4-17}$ aryl moiety containing one or more heteroatoms of nitrogen, oxygen or sulfur. Preferably, $Ar^1$ and $Ar^2$ are independently in each occurrence derived from benzene, naphthalene, anthracene, phenanthracene, pyridine, thiophene, pyrrole, furan, diazine or oxazine. Even more preferably, $Ar^1$ and $Ar^2$ are derived from benzene. The aryl moieties may optionally be substituted. Preferred moieties substituted on the aryl moieties include alkyl and alkoxy moieties. More preferred moieties substituted on the aryl moieties include $C_{1-20}$ alkyl and $C_{1-20}$ alkoxy moieties. Even more preferred moieties substituted on the aryl moieties include $C_{1-10}$ alkyl and $C_{1-10}$ alkoxy moieties. Most preferred moieties substituted on the aryl moieties include $C_{1-4}$ alkyl and $C_{1-4}$ alkoxy moieties.

E is a reactive group capable of undergoing chain extension or crosslinking or a trialkylsiloxy. Preferably, E is independently in each occurrence a hydroxy, glycidyl ether, acrylate ester, methacrylate ester, ethenyl, ethynyl, vinylbenzyloxy, maleimide, nadimide, trifluorovinyl ether, a cyclobutene bound to adjacent carbons on $Ar^2$, or a trialkylsiloxy. Even more preferably, E is a hydroxy, glycidyl ether, acrylate ester, methacrylate ester, ethenyl, ethynyl, maleimide or cyclobutene bound to adjacent carbons on $Ar^2$.

$R^1$ is independently in each occurrence a single bond; a sulfur; oxygen; $C_{1-20}$ divalent hydrocarbyl; a divalent silyl or polysilyl moiety bearing a $C_{1-10}$ hydrocarbyl moiety; a $C_{1-20}$ divalent hydrocarbyl further containing one or more of oxygen, sulfur, an arylamine, a carbonyl, a carbonyloxy, an amide, sulfinyl, sulfonyl, an aryl phosphinyl, or an aryl phosphine oxide; or a $C_{1-20}$ hydrocarbyl-substituted siloxy or polysiloxy. Preferably, $R^1$ is independently in each occurrence a single bond, a sulfur, oxygen or a $C_{1-20}$ divalent hydrocarbyl. Even more preferably, $R^1$ is independently in each occurrence a single bond, a sulfur, oxygen or a divalent benzene moiety.

$R^2$ is any substituent which does not interfere with the processing and the charge transport properties of the poly(tertiary di- or polyarylamine) and is preferably independently in each occurrence $C_{1-20}$ hydrocarbyl, $C_{1-20}$ hydrocarbyloxy, $C_{1-20}$ hydrocarbyl thioether, $C_{1-20}$ hydrocarbyl sulfonyl, $C_{1-20}$ hydrocarbyl sulfinyl, or two adjacent $R^2$ bonded to two of $Ar^1$ which are bonded to the same nitrogen atom to form a direct bond between the two aromatic rings or are bound to a divalent sulfur or divalent oxygen. Preferably, $R^2$ is independently in each occurrence $C_{1-20}$ hydrocarbyl or two adjacent $R^2$ bonded to two aromatic rings which are bonded to the same nitrogen atom to form a direct bond, or are bonded to a divalent sulfur or oxygen. Even more preferably, $R^2$ is independently in each occurrence $C_{1-10}$ alkyl or two adjacent $R^2$ bonded to two aromatic rings which are bonded to the same nitrogen atom to form a direct bond, or are bonded to a divalent sulfur or oxygen.

$R^3$ is independently in each occurrence a $C_{1-20}$ hydrocarbyl moiety or a moiety corresponding to the formula —$Ar^1(R^2)$—$Ar^2$—E. Preferably, $R^3$ is independently in each occurrence a $C_{1-20}$ alkyl, or $C_{6-18}$ aryl moiety or a moiety corresponding to the formula —$Ar^1(R^2)$—$Ar^2$—E. Even more preferably, $R^3$ is independently in each occurrence phenyl or a moiety corresponding to the formula —$Ar^1(R^2)$—$Ar^2$—E.

$R^4$ is independently in each occurrence hydrogen, a $C_{1-20}$ hydrocarbyl moiety, —$Ar^2(R^2)$—E or a moiety corresponding to Formula (III)

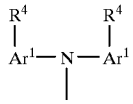

(III)

with the proviso that each poly(tertiary di- or polyarylamine) contains, on average, two or more units which are —$Ar^2(R^2)$—E. Preferably, $R^4$ is independently in each occurrence hydrogen, a $C_{1-10}$ alkyl moiety, —$Ar^2(R^2)$—E or a moiety corresponding to Formula (III) with the proviso that each poly(tertiary di- or polyarylamine) contains, on average, two or more units which are —$Ar^2(R^2)$—E. Even more preferably, $R^4$ is independently in each occurrence hydrogen, a methyl, —$Ar^2(R^2)$—E or a moiety corresponding to Formula (III) with the proviso that each poly(tertiary di- or polyarylamine) contains, on average, two or more units which are —$Ar^2(R^2)$—E.

m is a number of from about 0 to about 50. More preferably, m is a number of from about 0 to about 20. Most preferably, m is a number of from about 0 to about 5.

n is a number of from about 1 to about 50. More preferably, n is a number of from about 1 to about 20. Most preferably, n is a number of from about 1 to about 10.

The poly(tertiary di- or polyarylamines) of the invention demonstrate strong photoluminescence in dilute solutions or in the solid state. When such materials are exposed to light of a wavelength of about 300 to about 700 nanometers, the materials emit light of wavelengths in the region of about 400 to about 800 nanometers. More preferably, such materials absorb light of wavelengths of from about 300 to about 400 nanometers and emit light of wavelengths in the region of about 400 to about 650 nanometers. The poly(tertiary di- or polyarylamines) of the invention are readily soluble in common organic solvents. They are processable into thin films or coatings by conventional techniques. Upon curing, such films demonstrate resistance to common organic solvents and high heat resistance. The poly(tertiary di- or polyarylamines) of the invention are capable of crosslinking to form solvent-resistant, heat-resistant films at about 100° C. or more, more preferably at about 150° C. or more. Preferably, such crosslinking occurs at about 350° C. or less, more preferably about 300° C. or less and most preferably about 250° C. or less. The poly(tertiary di- or polyarylamines) of the invention preferably have oxidation potentials of about +0.1 volt or greater, more preferably +0.4 volt or greater and preferably +1.0 volt or less, more preferably +0.7 volt or less.

The poly(tertiary di- or polyarylamines) of this invention preferably have a weight average molecular weight of about 250 Daltons or greater, more preferably about 500 Daltons or greater, even more preferably about 1,000 Daltons or greater; preferably about 1,000,000 Daltons or less, more preferably about 500,000 Daltons or less and most preferably about 100,000 Daltons or less. Molecular weights are determined according to gel permeation chromatography using polystyrene standards.

Preferably, the poly(tertiary di- or polyarylamines) having the sum of m and n of 5 or greater demonstrate a polydispersity $(M_w/M_n)$ of 5 or less, more preferably 4 or less, even more preferably 3 or less, even more preferably 2.5 or less and most preferably 2.0 or less.

In a preferred embodiment, the acrylate and methacrylate ester reactive groups on $Ar^2$ correspond to Formula (IV).

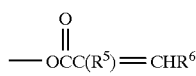

(IV)

Preferably, $R^5$ is hydrogen or $C_{1-4}$ alkyl and more preferably hydrogen or methyl. $R^6$ is preferably hydrogen, $C_{1-20}$ hydrocarbyl or $C_{1-20}$ hydrocarbyloxy. More preferably, $R^6$ is hydrogen or $C_{1-20}$ hydrocarbyl. Even more preferably, $R^6$ is hydrogen, $C_{1-10}$ alkyl or $C_{6-10}$ aryl or alkyl-substituted aryl. Even more preferably, $R^6$ is hydrogen, $C_{1-4}$ alkyl or phenyl. Most preferably, $R^6$ is hydrogen.

In a preferred embodiment, the ethenyl moiety on $Ar^2$ corresponds to Formula (V).

(V)

Preferably, $R^7$ is independently in each occurrence hydrogen, $C_{1-20}$ hydrocarbyl or $C_{1-20}$ hydrocarbyloxy, more preferably hydrogen, $C_{1-10}$ alkyl, $C_{6-10}$ aryl or alkyl-substituted aryl or $C_{1-20}$ alkoxy. Even more preferably, $R^7$ is hydrogen, $C_{1-4}$ alkyl, phenyl or $C_{1-4}$ alkoxy. Most preferably, $R^7$ is hydrogen or methyl.

In one embodiment, the $Ar^2$—E is a benzocyclobutene moiety which preferably corresponds to Formula (VI),

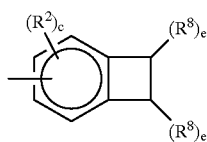
(VI)

wherein $R^2$ is preferably $C_{2-20}$ alkyl, $C_{1-20}$ alkoxy, $C_{1-20}$ alkylthio, $C_{6-20}$ aryl, $C_{6-20}$ aryloxy, $C_{6-20}$ arylthio, $C_{7-20}$ aralkoxy, $C_{7-20}$ alkaryloxy, $C_{7-20}$ alkarylthio, $C_{7-20}$ aralkyl, $C_{7-20}$ aralkoxy, $C_{7-20}$ aralkylthio, $C_{1-20}$ hydrocarbylsulfonyl or $C_{1-20}$ hydrocarbylsulfinyl. $R^2$ is more preferably $C_{1-20}$ alkyl. Most preferably, $R^2$ is $C_{1-3}$ alkyl. $R^8$ is preferably $C_{1-20}$ alkyl or $C_{1-20}$ hydrocarbyloxy. c is an integer of about 0 to about 3. Preferably, c is from about 0 to about 1 and most preferably 0. e is an integer of from about 0 to about 2, preferably from about 0 to about 1 and most preferably 0.

In one embodiment, the poly(tertiary di- or polyarylamines) are prepared by contacting one or more tertiary di- or polyarylamines having two halogen substituents with a haloaromatic compound having a reactive group capable of crosslinking or chain extension or a trialkylsiloxy moiety in the presence of a catalytic amount of a divalent nickel salt, at least a stoichiometric amount of zinc powder, a trihydrocarbylphosphine and a catalytic amount of a compound capable of accelerating the reaction in a polar solvent and an optional co-solvent comprising an aromatic hydrocarbon or ether. The nickel (zero valent) catalyst is prepared in situ by contacting a divalent nickel salt with a reducing agent in the presence of a material capable of acting as a ligand and optionally a material capable of accelerating the reactions.

The starting materials for this process are one or more tertiary di- or polyarylamines having 2 halogen substituents. The tertiary di- or polyarylamines preferably correspond to Formulas (VII), (VIII), and/or (IX).

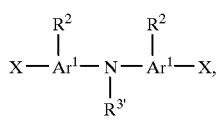
(VII)

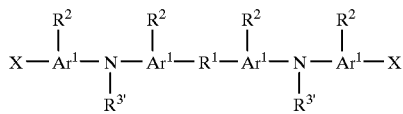
(VIII)

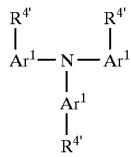
(IX)

$Ar^1$ and $R^2$ are as defined previously.

X is independently in each occurrence halogen, more preferably chlorine or bromine, and most preferably bromine.

$R^{3'}$ is independently in each occurrence a $C_{1-20}$ hydrocarbyl moiety or $Ar(R^2)X$. Preferably, $R^{3'}$ is independently in each occurrence a $C_{1-20}$ alkyl, $C_{6-18}$ aryl moiety or $Ar(R^2)X$. More preferably, $R^{3'}$ is phenyl.

$R^{4'}$ is independently in each occurrence hydrogen a $C_{1-20}$ hydrocarbyl moiety, X or a moiety corresponding to Formula (X),

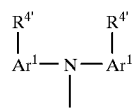
(X)

with the proviso that about two units per molecule are X. Preferably, $R^{4'}$ is hydrogen, a $C_{1-10}$ alkyl moiety, X or a moiety corresponding to Formula (X) with the proviso that about two units per molecule are X. More preferably, $R^{4'}$ is independently in each occurrence hydrogen, a methyl, X or a moiety corresponding to Formula (X) with the proviso that about two units per molecule are X.

The tertiary di- or polyarylamines useful as starting materials in this invention preferably contain two halogen moieties. Such compounds are generally prepared by reacting tertiary di- or polyarylamines which do not contain a halogen with molecular halogen in a solvent such as a halohydrocarbon or a carboxylic acid. Alternatively, the tertiary di- or polyarylamines containing about two halogen moieties may be prepared by contacting the tertiary di- or polyarylamines with bromosuccinimide in a polar solvent which dissolves the bromosuccinimide. This process is described in R. H. Mitchell, Y. H. Lai, R. V. Williams, J. Org. Chem., Vol. 44, p. 4733 (1979), relevant parts incorporated by reference. Examples of tertiary di- or polyarylamines which contain about two halogen moieties include N,N-di-(4-bromophenyl)-p-toluidine, tri(4-bromophenyl)amine, N,N'-di-(4-bromophenyl)-N,N'-di-(4-methylphenyl)-benzidine, N,N'-di-(4-bromophenyl)-N,N'-di-(4-pentoxyphenyl)benzidine, N,N'-di-(4-bromophenyl)-N,N'-di-(4-pentyloxyphenyl)-1,4-phenylenediamine, N,N'-di-(4-bromophenyl)-N,N'-di-(4-methoxyphenyl)-1,4-phenylenediamine and N,N-di-(4-bromophenyl)-p-anisidine.

Examples of tertiary di- or polyarylamines useful in this invention include diphenyl-p-toluidine, N,N-diphenyl-p-anisidine, triphenylamine, N,N'-diphenyl-N,N'-di-(4-pentoxyphenyl)benzidine, N,N'-diphenyl-1,4-phenylenediamine, N,N'-diphenyl-N,N'-di-(4-methoxyphenyl)-1,4-phenylenediamine, N,N'-diphenyl, N,N'-di-(4-pentoxyphenyl)-1,4-phenylenediamine, N,N'-di-4(4'-hydroxybiphenyl)-N,N'-di-(4-pentoxyphenyl)-benzidine, N,N'-di-4(4'-hydroxybiphenyl)-N,N'-di-(4-pentoxyphenyl)-1,4-phenylenediamine and N,N-di-(4-bromophenyl)p-anisidine.

Preferably, the haloaromatic compound having a reactive group capable of crosslinking or chain extension or a trialkylsiloxy moiety, corresponds to the formula $E-Ar^2-X$ wherein $Ar^2$, E and X are as previously defined. Preferably, the haloaromatic compound corresponds to Formulas (XI) or (XII).

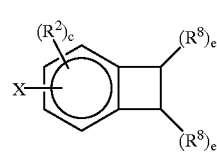
(XI)

(XII)

Z is a trialkylsiloxy, glycidyl ether, acrylate ester, methacrylate ester, ethenyl, ethynyl, maleimide vinylbenzyloxy or a trifluorovinyl ether moiety. Preferably, Z is a trialkylsiloxy moiety, ethenyl, ethynyl, maleimide or trifluorovinyl ether moiety. More preferably, Z is a trialkylsiloxy moiety.

In one preferred embodiment, the haloaromatic compound is a halogen-substituted benzocyclobutene moiety according to Formula (XII).

Examples of haloaromatic compounds useful in this invention include bromostyrene, bromophenyltrialkylsilyl ethers, bromobenzocyclobutene, N-(bromophenyl) maleimide, N-(bromophenyl)trifluorovinyl ether and N-(bromophenyl)nadimide.

The tertiary di- or polyarylamines having about two halogen substituents and the haloaromatic compound may be contacted in a wide range of ratios, depending upon the desired degree of oligomerization or polymerization. Preferably, the mole ratio of tertiary di- or polyarylamines to haloaromatic compound is about 0.5 or greater, preferably about 1.0 or greater and more preferably about 2 or greater. Preferably, the mole ratio is about 50 or less, and more preferably about 25 or less. Higher ratios facilitate the preparation of higher molecular weight oligomers and polymers.

In a preferred embodiment, the reaction of the tertiary di- or polyarylamines with the haloaromatic compound takes place according to the procedures of Colon et al., described in *Journal of Polymer Science, Part A, Polymer Chemistry Edition*, Vol. 28, p. 367 (1990), incorporated herein by reference, and Colon et al., *Journal of Organic Chemistry*, Vol. 51, p. 2627 (1986), relevant parts incorporated herein by reference.

The reactants are contacted in a polar solvent, preferably dimethylformamide, N,N-dimethylacetamide or N-methylpyrrolidinone. Up to about 50 volume percent of a non-amide co-solvent can be used. Preferable co-solvents are aromatic hydrocarbons and ethers, for instance, tetrahydrofuran. The process is preferably conducted in the absence of oxygen and moisture, as the presence of oxygen is detrimental to the catalyst and the presence of a significant amount of water leads to premature termination of the process. More preferably, the reaction is performed under an inert atmosphere such as nitrogen or argon.

The catalyst is formed from a divalent nickel salt. The nickel salt may be any nickel salt which can be converted to the zero valent state under reaction conditions. Preferable nickel salts are the nickel halides, with nickel chloride and nickel bromide most preferred. The divalent nickel salt is present in an amount of about 0.01 mole percent or greater, more preferably about 0.1 mole percent or greater and most preferably about 1.0 mole percent or greater based on the amount of haloaromatic compound and tertiary di- or polyarylamine present. The amount of divalent nickel salt present is preferably about 30 mole percent or less, more preferably about 15 mole percent or less based on the amount of haloaromatic compound and tertiary di- or polyarylamine present.

The reaction is performed in the presence of a material capable of reducing the divalent nickel ion to the zero valent state. Suitable material includes any metal which is more easily oxidized than nickel. Preferable metals include zinc, magnesium, calcium and lithium. The preferred reducing agent is zinc in the powder form. At least stoichiometric amounts of reducing agent based on haloaromatic compounds are required to maintain the nickel species in the zero valent state throughout the reaction. Preferably, about 150 mole percent or greater, more preferably about 200 mole percent or greater, and most preferably about 250 mole percent or greater based on the haloaromatic compound and tertiary di- or polyarylamine is used. More preferably, the reducing agent is present in an amount of about 500 mole percent or less, more preferably about 400 mole percent or less and most preferably about 300 mole percent or less based on the amount of haloaromatic compound and tertiary di- or polyarylamine.

The process is performed in the presence of a material capable of acting as a ligand. Preferred ligands include trihydrocarbylphosphines. More preferred ligands are triaryl or trialkylphosphines with triphenylphosphines being the most preferred. The compound capable of acting as a ligand is present in an amount of from about 10 mole percent or greater, more preferably about 20 mole percent or greater based on the haloaromatic compound and tertiary di- or polyarylamine. The compound capable of acting as a ligand is preferably present in an amount of about 100 mole percent or less, more preferably about 50 mole percent or less and most preferably about 40 mole percent or less based on the amount of haloaromatic compound and tertiary di- or polyarylamine.

The reaction is performed in the presence of a compound capable of accelerating the reaction. Such accelerator comprises 2,2'-bipyridine or an alkali metal halide. Preferred alkali metal halides useful as accelerators include sodium bromide, potassium bromide, sodium iodide and potassium iodide. The most preferred accelerator is 2,2'-bipyridine. The accelerator is used in a sufficient amount to accelerate the reaction. Preferably, the accelerating compound is used in an amount of about 0.1 mole percent or greater, preferably about 0.5 mole percent or greater and most preferably about 1.0 mole percent or greater based on the haloaromatic compound and tertiary di- or polyarylamine. Preferably, the accelerating compound is present in an amount of about 100 mole percent or less, more preferably about 50 mole percent or less and most preferably about 5 mole percent or less based on the amount of haloaromatic compound and tertiary di- or polyarylamine.

The reaction can be performed at any temperature at which the reaction proceeds at a reasonable rate. Preferably, the reaction is performed at a temperature of about 25° C. or greater, more preferably about 50° C. or greater and most preferably about 70° C. or greater. Below about 25° C., the rate of reaction is unacceptably low. Preferably, the reaction is performed at a temperature of about 200° C. or less, more preferably about 150° C. or less and most preferably about 125° C. or less. Temperatures substantially higher than about 200° C. can lead to degradation of the catalyst. The reaction time is dependent upon the reaction temperature, the amount of catalyst and the concentration of the reactants. Reaction times are preferably about 1 hour or greater and more preferably about 10 hours or greater. Reaction times are about 100 hours or less, more preferably about 72 hours or less and most preferably about 48 hours or less. The amount of solvent used in this process can vary over a wide range. Generally, it is desired to use as little solvent as possible. Preferably, about 10 liters of solvent per mole of tertiary di- or polyarylamines or less are used, more preferably about 5 liters or less is used, and most preferably about 2 liters or less is used. The lower limit on amount of solvent used is determined by practicality, that is, handleability of the solution and solubility of the reactants and products in the solvent. The resulting poly(tertiary di- or polyarylamines) are recovered according to conventional techniques; preferred techniques include filtration and precipitation using a nonsolvent.

In another embodiment, the poly(tertiary di- or polyarylamines) may be prepared by a process disclosed in Ioyda et al., *Bulletin of the Chemical Society of Japan*, Vol. 63, p. 80 (1990), relevant parts incorporated herein by reference. Such method is similar to the method described hereinbefore. In particular, the catalyst is a divalent nickel salt introduced as a nickel halide bis-triphenylphosphine complex. The reaction may be performed in a variety of solvents including acetone, dimethylformamide, tetrahydrofuran and acetonitrile. The reaction is accelerated by the addition of about 10 mole percent of an organo-soluble iodide such as tetraethylammonium iodide. Such a reaction is performed at a temperature of from about 20° C. to about 100° C. for about 1 to about 24 hours.

In another embodiment, the subject compounds of the invention may be prepared via the processes disclosed by Yamamotto, *Progress in Polymer Science*, Vol. 17, p. 1153 (1992), relevant parts incorporated herein by reference. In such process, tertiary di- or polyarylamines containing about two halogen substituents and the appropriate amount of reactive haloaromatic compounds are contacted with at least a stoichiometric amount of nickel catalyst in the form of nickel (1,5-cyclooctadiene) complex and at least a stoichiometric amount of 1,5-cyclooctadiene as a ligand in an inert solvent, such as tetrahydrofuran. The reaction is preferably conducted at about 70° C. or higher for about two or more days.

In another embodiment, the subject compounds of the invention may be prepared by the process disclosed in Miyaura et al., *Synthetic Communication*, Vol. 11, p. 513 (1981), and Wallow et al., *American Chemical Society Polymer Preprint*, Vol. 34 (1), p. 1009 (1993), relevant parts of both references incorporated herein by reference. In such process, the halogens on the haloaromatic compound or the tertiary di- or polyarylamine are converted to the corresponding lithio- or Grignard moieties. Such processes are well known in the art, see for example March, *Advanced Organic Chemistry*, 2d Ed., pp. 408–414 (McGraw-Hill, 1977). The tertiary di- or polyarylamine or haloaromatic compound is reacted with a trialkyl borate to form the corresponding boronic acid. M. Rehalin et al., as disclosed in *Makromoleculaire Chemie*, Vol. 191, pp. 1991–2003 (1990), relevant parts incorporated herein by reference. The resulting boronic acid is reacted with the corresponding halogen-containing tertiary di- or polyarylamine or haloaromatic compound, respectively. In the embodiment where the poly(tertiary di- or polyarylamines) comprise more than one tertiary di- or polyarylamine and a single class of crosslinking or chain extension moiety, the aromatic boronic acid substituted with the desired class of crosslinking or chain extension moiety is reacted with the appropriate halogen-substituted tertiary di- or polyarylamines. In the embodiment where the poly(tertiary di- or polyarylamines) comprise more than one class of crosslinking or chain extension moiety, the boronic acid derivative of the tertiary di- or polyarylamine is reacted with more than one haloaromatic compound having more than one class of crosslinking or chain extension moieties. The boronic acid derivative is reacted with the appropriate halogenated tertiary di- or polyarylamines or haloaromatic compound in the presence of a catalytic amount of tetrakis(triphenylphosphine)-palladium (0) and an aqueous base under conditions such that poly(tertiary di- or polyarylamines are prepared.

The tertiary di- or polyarylamines useful in this process preferably correspond to formulas XIII, XIV and XV.

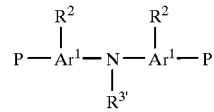

(XIII)

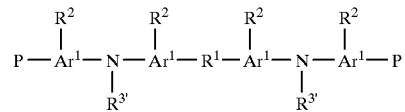

(XIV)

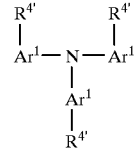

(XV)

The aromatic compound having a reactive group capable of crosslinking or chain extension, or a trialkylsiloxy moiety, preferably corresponds to the formula E—Ar$^2$—Q (XVI).

In Formulae (XIII), (XIV) and (XV):
E, Ar$^1$, Ar$^2$, R$^1$, R$^2$, R$^{3'}$, R$^3$ R$^4$, R$^{4'}$ and R$^4$ are as previously defined;
P is a boronic acid, chloro or bromo moiety, and
Q is a boronic acid, chloro or bromo moiety,
with the proviso that one of P or Q must be a boronic acid moiety and the other must be chloro or bromo.

The tertiary di- or polyarylamines and haloaromatic compound, in appropriate forms, may be contacted in a wide range of ratios, depending upon the desired degree of oligomerization or polymerization. Preferably, the mole ratio of tertiary di- or polyarylamine to haloaromatic compound is about 0.5 or greater, preferably about 1.0 or greater and more preferably about 2.0 or greater. Preferably, the ratio is about 50 or less, and more preferably about 25 or less.

The tetrakis(triphenylphosphine)-palladium (0) may be generated in situ by the addition of a soluble palladium salt (for instance palladium acetate or palladium chloride) and at least four molar equivalents of triphenylphosphine.

The catalyst is present in a sufficient amount to promote the desired reaction and to facilitate a reasonable rate of reaction. Preferably, the catalyst is present in an amount of about 0.01 mole percent or greater, more preferably about 0.1 mole percent or greater and most preferably about 1.0 mole percent or greater based on the amount of haloaromatic compound and tertiary di- or polyarylamines present. The tetrakis(triphenylphosphine)-palladium (0) is preferably present in an amount of about 20 mole percent or less, more preferably about 10 mole percent or less and most preferably about 5 mole percent or less based on the amount of haloaromatic compound and tertiary di- or polyarylamine present.

The reactants are contacted in a solvent which does not react with the reactants or deactivate the catalysts. Preferable solvents include aromatic hydrocarbons, lower alkanols, aliphatic ethers and N,N-dialkylamides; with toluene and ethanol being more preferred.

The process is preferably conducted in the absence of oxygen, as the presence of oxygen is detrimental to the catalyst. More preferably, the reaction is performed under an inert atmosphere such as nitrogen or argon.

The reaction can be performed at any temperature at which the reaction proceeds at a reasonable rate. Preferably, the reaction is performed at a temperature of about 50° C. or greater, more preferably about 70° C. or greater and most preferably about 80° C. or greater. Below about 50° C., the rate of reaction is unacceptably low. Preferably, the reaction is performed at a temperature of about 150° C. or less, more preferably about 130° C. or less and most preferably about 100° C. or less. Temperatures substantially higher than about 150° C. can lead to degradation of the catalyst. The reaction time is dependent upon the reaction temperature, the amount of catalyst and the concentration of the reactants. Reaction times are preferably about 10 hours or greater and more preferably about 20 hours or greater. Reaction times are about 100 hours or less, more preferably about 50 hours or less and most preferably about 20 hours or less. The amount of solvent used in this process can vary over a wide range. Generally, it is desired to use as little solvent as possible. Preferably, about 100 liters of solvent per mole of tertiary di-polyarylamine or less is used, more preferably about 75 liters or less, and most preferably about 50 liters or less. The lower limits on amount of solvent used is determined by practicality, that is, handleability of the solution and solubility of the reactants and products in the solvent. The resulting poly(tertiary di- or polyarylamines) are recovered according to conventional techniques; preferred techniques include filtration and precipitation using a nonsolvent.

In the embodiment wherein the reactive moieties on the poly(tertiary di- or polyarylamines) are trialkylsiloxy moieties, the trialkylsiloxy moieties may be converted to hydroxy moieties by contact with concentrated acid, such as hydrochloric acid, in an organic solvent. The hydroxy moieties may be converted to cyanate moieties by well-known cyanation reactions. See, for example, U.S. Pat. No. 4,478, 270; Martin, *Organic Synthesis*, Vol. 61, p. 35; and *Handbook of Preparative Inorganic Chemistry*, p. 1662 (1963), Academic Press, New York. The relevant teachings of these references are incorporated herein by reference. In one preferred embodiment, the hydroxy-substituted poly(tertiary di- or polyarylamines) are contacted with cyanogen halide dissolved in a chlorinated hydrocarbon or a secondary or tertiary alcohol in the presence of a tertiary amine at a temperature of about 0° C. or less under conditions such that the hydroxy moieties are replaced with cyanate moieties. Preferably, the contacting occurs in the presence of a dilute base such as alkali or alkaline metal hydroxides, alkali or alkaline metal carbonates, alkali or alkaline metal bicarbonates or tertiary amines. Preferred bases are the tertiary amines with the aliphatic tertiary amines being most preferred. This process is preferably run at a temperature of about 0° C. or lower with temperatures of about –10° C. or lower being most preferred. It is preferable to perform such process under an inert gas atmosphere. The cyanated poly (tertiary di- or polyarylamines) may be recovered by washing the reaction solution with a dilute base to remove excess cyanogen chloride. The reaction solution is thereafter washed with water so as to remove any salt prepared from the hydrochloride by-product and base. The reaction solution is then contacted with the dilute acid to neutralize any base which may be present. Thereafter, the reaction solution is contacted with water again so as to remove any other impurities and the cyanated poly(tertiary di- or polyarylamines) are recovered by drying the solution with the use of a dessicant.

In another embodiment, the hydroxy moieties of the hydroxy-substituted poly(tertiary di- or polyarylamines) may be converted to glycidyl ether moieties by processes well known in the art. Such glycidyl ethers are preferably prepared by contacting the hydroxy-substituted poly(tertiary di- or polyarylamines) with epihalohydrin under conditions to form aryl moieties with chlorohydrin groups at their termini. The chlorohydrin groups are dehydrohalogenated to form an epoxy or glycidyl ring by contacting them with sodium hydroxide. Such process is described in *Handbook of Epoxy Resins*, McGraw-Hill, New York, N.Y. USA (1967), relevant parts incorporated herein.

The poly(tertiary di- or polyarylamines) are useful in preparing coatings and films. Such coatings and films can be useful as charge transport layers in polymeric light-emitting diodes, in protective coatings for electronic devices and as fluorescent coatings. The thickness of the coating or film is dependent upon the ultimate use. Generally, such thickness can be from about 0.01 to about 200 microns. In that embodiment wherein the coating is used as a fluorescent coating, the coating or film thickness is from about 50 to about 200 microns. In that embodiment where the coatings are used as electronic protective layers, the thickness of the coating can be from about 5 to about 20 microns. In that embodiment where the coatings are used in a polymeric light-emitting diode, the thickness of the layer formed is about 0.05 to about 2 microns. The compounds of the invention and their oligomers or polymers form good pinhole- and defect-free films. Such films can be prepared by means well known in the art, including spin-coating, spray-coating, dip-coating and roller-coating. Such coatings are prepared by a process comprising applying a composition to a substrate and exposing the applied composition to conditions such that a film is formed. The conditions which form a film depend upon the application technique and the reactive end-groups of the aryl moiety. In a preferred embodiment, the composition applied to the substrate comprises the poly(tertiary di- or polyarylamines) dissolved in a common organic solvent. Preferred solvents are aliphatic hydrocarbons, chlorinated hydrocarbons, aromatic hydrocarbons, ketones, ethers and the like. It is preferable that such solvents have relatively low polarity. Preferably, the solution contains from about 0.5 to about 10 weight percent of the poly(tertiary di- or polyarylamine). For thin coatings, it is preferred that the composition contains from about 0.5 to about 5.0 percent by weight of the poly(tertiary di- or polyarylamine). This composition is then applied to the appropriate substrate by the desired method. The coating is then exposed to the necessary conditions to cure the film, if needed, to prepare a film having high solvent and heat resistance. The films are preferably substantially uniform in thickness and substantially free of pinholes. Preferably, the films are cured when exposed to temperatures of about 100° C. or greater, more preferably about 150° C. or greater and most preferably about 200° C. or greater. Preferably, the films cure at a temperature of about 300° C. or less. Preferably, the films cure after exposure to the temperatures described previously for 10 minutes or greater. Preferably, the films cure after exposure to the temperatures described previously for 24 hours or less, more preferably 12 hours or less and most preferably 6 hours or less.

In the preparation of the films, the composition may further comprise a catalyst suitable to facilitate or initiate the curing of the films. Such catalysts are well known in the art; for instance, for materials having ethylenic unsaturation, a free radical catalyst may be used. For aryl moieties with glycidyl ethers as end-groups, ureas, imidazoles and the like may be used to improve or aid in curing. In the preparation of films from compounds of the invention with glycidyl ether aryl-terminal moieties, such materials may be reacted with commonly known curing agents which facilitate crosslinking. Among preferred curing agents are tetrahydrophthalic anhydride, nadic anhydride and maleic anhydride.

In another embodiment, the poly(tertiary di- or polyarylamines) may be partially cured. This is known as B-staging. In such embodiment, the poly(tertiary di- or polyarylamines) thereof are exposed to conditions such that a portion of the reactive materials cure and a portion of the reactive materials do not cure. This is commonly used to improve the processability of such a resin and can facilitate the preparation of the films. Such B-staged material can thereafter be used to prepare coatings by the means disclosed hereinbefore. Preferably, about 10 mole percent or greater of the reactive moieties are reacted. Preferably, about 50 mole percent or less of the reactive moieties are reacted.

Specific Embodiments

The following examples are included for illustrative purposes only and do not limit the scope of the claims. Unless otherwise stated, all parts and percentages are by weight.

EXAMPLE 1

Preparation of N,N-di(4-bromophenyl)-p-toluidine

A solution of N-bromosuccinimide (138.23 g, 0.78 mol) in 300 mL of dimethylformamide (DMF) was slowly added with stirring to a solution of N,N'-diphenyl-p-toluidine (99.7 g, 0.38 mol) in 300 mL of dimethylformamide (DMF). The rate of addition was such that the reaction temperature was kept below 50° C. The reaction was stirred for an additional 15 minutes after the addition was complete. The reaction mixture was slowly added to water (300 mL) to precipitate the product. The crude product was recrystallized from ethanol to afford 153.4 g (85 percent) of slightly yellow crystals after drying overnight in a vacuum oven at 60° C.

EXAMPLE 2

Preparation of N,N-di(4-bromopheny)-p-anisidine

Solution of N-bromosuccinimide (13.1 g, 72.6 mmol) in 50 mL of DMF was slowly added with stirring to a solution of N,N-diphenyl-p-anisidine (10.0 g, 36.3 mmol) in 50 mL of DMF. The rate of addition was such that the reaction temperature was kept below 50° C. The reaction was stirred for an additional 15 minutes after completion of addition. The reaction mixture was added to 200 mL of water in a separatory funnel. The mixture was extracted with hexane (250 mL). The organic layer was further washed with water (2×200 mL) then dried over anhydrous $MgSO_4$. The solvent was removed under reduced pressure to afford a slightly yellow oil which crystallized upon standing. Hexane (40 mL) was added to the flask and the contents were cooled to 4° C. for 16 hours. The crystals were collected in a Buchner funnel, washed with hexane (3×25 mL) then dried in a vacuum oven at 60° C. for 4 hours to afford 13.0 g (82 percent) of white crystals.

EXAMPLE 3

Preparation of crosslinkable oligomer from N,N'-di (4-bromophenyl)-p-toluidine and bromobenzocyclobutene To a dry reactor equipped with a mechanical stirrer, nitrogen/vacuum inlet, and a rubber septum was added triphenylphosphine (3.9 g, 15 mmol), zinc powder (5.9 g, 90 mmol) and nickel chloride-2,2'-bipyridine complex ($NiCl_2$-Bipy) (0.26 g, 0.9 mmol). The reactor was evacuated to about 0.2 mm Hg and was then purged with nitrogen. This cycle of evacuation and purging was repeated 7 times. To the reactor was added a solution of N,N-di(4-bromophenyl)-p-toluidine (12.51 g, 30 mmol) and bromobenzocyclobutene (BrBCB) (2.2 g, 12 mmol) in anhydrous N,N'-dimethylacetamide (DMAc) (45 mL). The reaction mixture was stirred at 80° C. for about 16 hours and then was added to dichloromethane (500 mL). The solution was filtered through a bed of filtering aid to remove the unreacted zinc and the filtrate concentrated on a roto-evaporator under reduced pressure. The concentrate was added to methanol to give a yellow precipitate. The yellow powder was collected and washed with ethanol (2×150 mL). The dried product was 9.12 g of a yellow powder containing a trace of triphenylphosphine. It was refluxed in hexane (300 mL) for 30 minutes, collected in a Buchner funnel and washed with hot hexane (3×150 mL). After drying in a vacuum oven at 40° C. for 4 hours, a pale yellow powder was obtained (8.05 g, 88 percent).

Proton NMR integration of the methylene protons of benzocyclobutene (BCB) versus the methyl protons was performed to determine the ratio of triarylamine unit to BCB. Differential scanning calorimetry (DSC) analysis at 10° C./minute was performed on the polymer. UV absorption and photoluminescence spectra of a chloroform solution of the product were taken. A thin film spin coated on a quartz plate from a 0.5 weight percent chloroform solution was heated at 2.5° C./minute to 250° C. then held at 250° C. for 1 hour. UV absorption and photoluminescence spectra of the film were taken. UV absorption of the cured film showed a slight shift of the peak maximum to 354 nm. Photoluminescence spectrum of the cured film showed an intense, broad emission peak at 490 nm and a minor peak at 420 nm. Cyclic voltammetry on the oligomer in solution and a film cured onto a carbon electrode was performed to determine reversible oxidation potentials. These data are compiled in Table 1 and demonstrate that crosslinking had no effect on the redox process and that the polymeric films are suitable for charge transport.

EXAMPLE 4

Preparation of crosslinkable oligomer from N,N-di (4-bromophenyl)-p-anisidine and bromobenzocyclobutene The above procedure was repeated with 1.95 g (7.5 mmol) of triphenylphosphine, 2.95 g (45 mmol) of zinc dust, 0.13 g (0.45 mmol) of $NiCl_2$-Bipy, 6.5 g (15 mmol) of N,N-di (4-bromophenyl)-p-anisidine, 1.1 g (6 mmol) of BrBCB and 23 mL of DMAc. The reaction mixture was heated at 80° C. for 17 hours and was then added to 150 mL of dichloromethane. The resulting solution was filtered to remove the unreacted zinc and concentrated. The concentrate was added to methanol to precipitate the crude product which was then refluxed in 300 mL of hexane and washed with more hot hexane (2×100 mL). After drying in a vacuum oven at 40° C. for 4 hours, a pale yellow powder (4.41 g, 93 percent) was obtained. The product and a film prepared as described in Example 3 were tested in the same manner as described in Example 3. The results are compiled in Table 1. These data demonstrate that crosslinking had no effect on the redox process and that the polymeric films are suitable for charge transport. The absorption peak of the cure film showed only a slight drop in intensity after exposure to xylenes and chloroform. This demonstrates the solvent resistance of the crosslinked polymer film.

EXAMPLE 5

Coupling of bromobenzocyclobutene to tri(4-bromophenyl)amine

A tetrahydrofuran (THF) solution of BCB Grignard was prepared from 12.08 g (66 mmol) of BrBCB, 1.46 g (60 mmol) of magnesium turnings, and 20 mL of THF. To this solution was then added 0.03 g (0.1 mmol) of NiCl$_2$-Bipy followed by a THF (15 mL) solution of tri(4-bromophenyl) amine (4.8 g, 10 mmol). After stirring at room temperature for 4.5 hours, the solution was added to 300 mL of dichloromethane in a separatory funnel and was washed with water (2×500 mL). The organic layer, after drying and removal of solvent, gave a yellow oil which was dissolved in 80 mL of dichloromethane. The crude product was precipitated by adding the dichloromethane solution to 700 mL of hexane. Reworking the dichloromethane-hexane solution gave additional crude product. The combined crude product was heated to 150° C. under reduced pressure (0.2 mm Hg) to remove bis-benzocyclobutene to give a yellow glassy solid (3.3 g). Liquid chromatography-mass spectrometry analysis of the product showed it to be a mixture of the following composition.

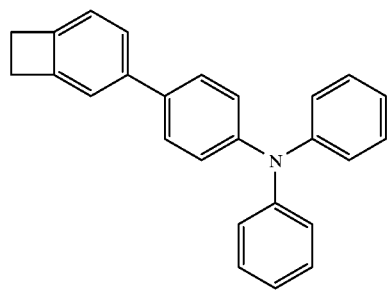

5%

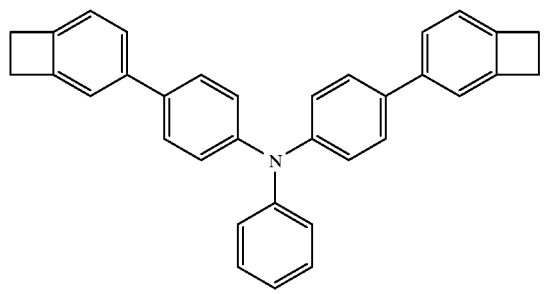

29%

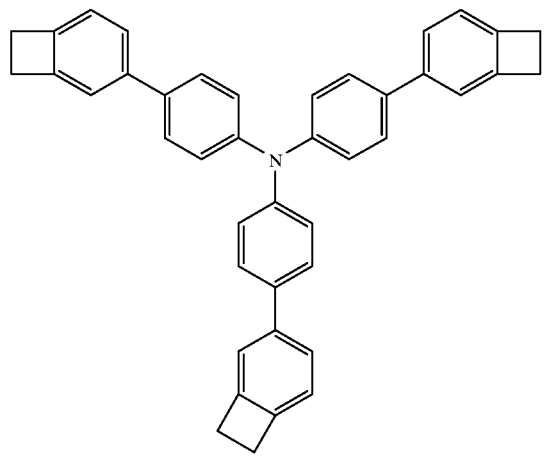

49%

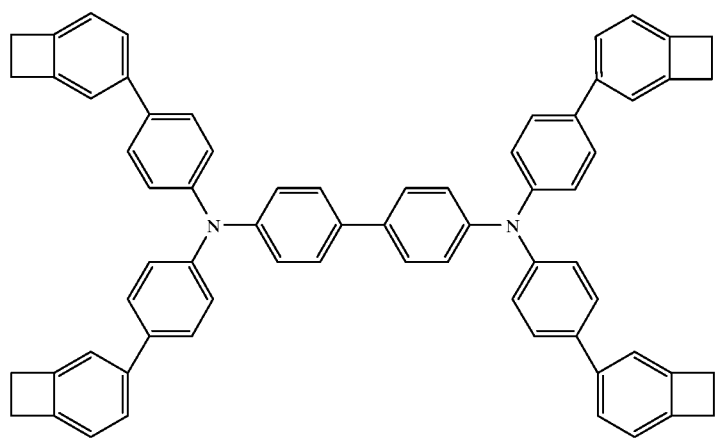

7%

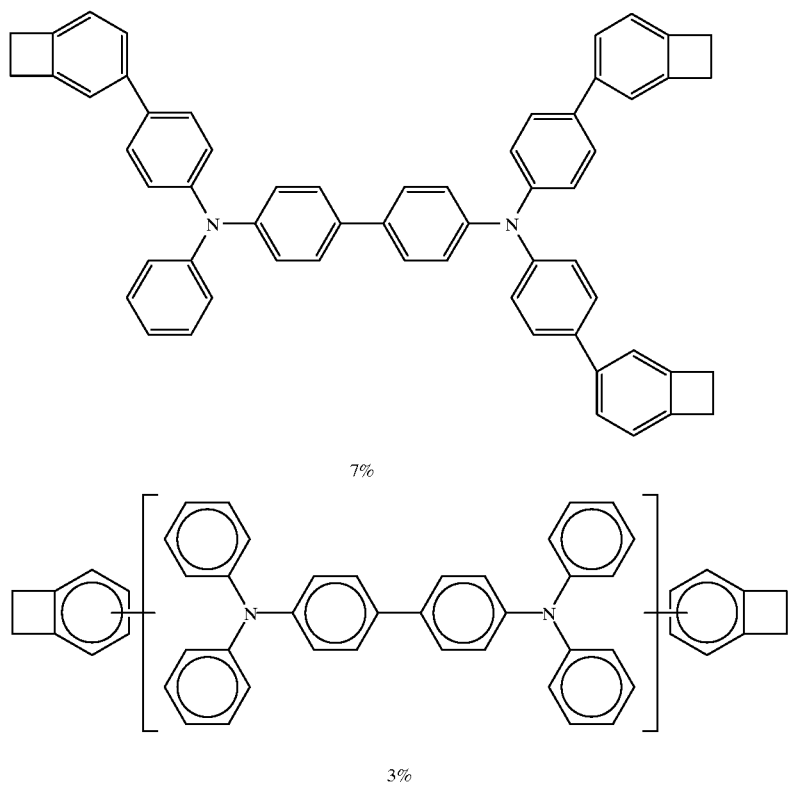

EXAMPLE 6

Coupling of bromobenzocyclobutene to tri(4-bromophenyl)amine

The procedure of Example 5 was repeated using a Grignard solution from THF (20 mL), magnesium turnings (1.46 g, 60 mmol), BrBCB (1.5 g), tri(4-bromophenyl)amine (2.4 g, 5 mmol) and nickel (II) acetylacetonate (0.008 g, 0.03 mmol). The Grignard solution was filtered into an addition funnel and was then added to a THF solution of tri(4-bromophenyl)amine and nickel catalyst previously cooled to −20° C. The reaction mixture was stirred at −20° C. for 1 hour and was then worked up as described in Example 5. Liquid chromatography-mass spectrometry analysis showed that the product had about the same composition as described in Example 5.

EXAMPLE 7

Preparation of crosslinked polymer from a blend of oligomers from Examples 3 and 6

A blend of 4.05 g of the product from Example 3 and 0.45 g of the product from Example 6 was prepared by a solution process. The product and a film prepared as described in Example 3 were tested in the same manner as described in Example 3. The results are compiled in Table 1. After heating a sample in a DSC cell from room temperature to 280° C. at 3° C./minute and then at 280° C. for 90 minutes, the blend was fully cured and the resulting polymer had a Tg of about 242° C. The thin film prepared as described in Example 3 was then cured by heating to 280° C. at 2.5° C./minute and at 280° C. for 1 hour. The intensity of the absorption peak of the film was unaffected by exposure to xylenes and diminished by about 2 percent after exposure to chloroform, thus demonstrating its solvent resistance. A film cured on the surface of a carbon electrode was analyzed by cyclic voltammetry. It showed an oxidation potential of +0.84 volt relative to Ag/AgCl and the cyclic voltammetry trace was reproducible through many redox cycles. This demonstrates the utility and durability of this polymeric film as a charge transport layer.

EXAMPLE 8

Preparation of 4-(t-butyldimethylsilyloxy) benzeneboronic acid

A dry reactor equipped with two addition funnels, nitrogen inlet, and a mechanical stirrer was set up over a dry ice bath. To one of the addition funnels was added a filtered, preformed Grignard reagent from the reaction of 4-(t-butyldimethylsilyloxy)-bromobenzene (28.7 g, 0.1 mol) with magnesium turnings (2.96 g, 0.12 mol) in THF (70 mL). To the other addition funnel was added trimethylborate (12.48 g, 0.12 mol) in THF (50 mL). The reactor was charged with about 10 mL of the borate solution and was cooled to −70° C. About 10 mL of the Grignard solution was then added. The remaining borate and Grignard solutions were then added in aliquots in such a way as to ensure a slight excess of borate. The reaction mixture was stirred at −70° C. for one hour then stirred at room temperature for 20 hours. The reactor was cooled to 0° C. and water (100 mL) was slowly added with vigorous stirring. The mixture was extracted with ether (400 mL). The ether layer was washed with water (2×200 mL), dried over anhydrous $MgSO_4$, then concentrated on a roto-evaporator to afford a light-tan-colored solid (22.0 g, 87 percent). $^1H$ and $^{13}C$ NMR spectra were consistent with the following structure.

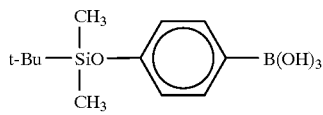

EXAMPLE 9

Preparation of 4-benzocyclobuteneboronic acid

The process described in Example 8 was performed with a preformed Grignard reagent from the reaction of 4-bromobenzocyclobutene (18.3 g, 0.1 mol) with magnesium turnings (2.92 g, 0.12 mol) in THF (80 mL) and trimethylborate (12.5 g, 0.12 mol) in THF (80 mL). To recover the product, the reactor was cooled to 0° C. and water (50 mL) was slowly added with vigorous stirring. The reaction was neutralized with aqueous $H_2SO_4$, and was extracted with ether (2×300 mL). The ether layer was washed with water (2×150 mL), dried over anhydrous $MgSO_4$, then concentrated on a roto-evaporator to afford an off-white color solid (14.22 g, 96 percent). $^1H$ and $^{13}C$ NMR spectra were consistent with the following structure.

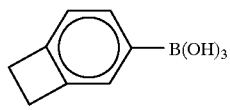

EXAMPLE 10

Preparation of 4-vinylbenzeneboronic acid

The procedure of Example 9 was repeated with the following reagents: 4-bromostyrene (9.15 g, 0.05 mol), magnesium turnings (1.46 g, 0.06 mol), THF (40 mL), and trimethylborate (6.24 g, 0.06 mol in 30 mL of THF). After work-up, an off-white solid (6.9 g, 93 percent) was isolated. $^1H$ and $^{13}C$ NMR spectra were consistent with the following structure.

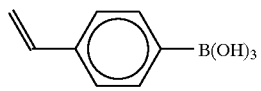

EXAMPLE 11

Preparation of N,N-Di-(4-bromophenyl)-p-tolylamine

To a stirred solution of N,N'-diphenyl-p-tolylamine (99.7 g, 0.38 mol) in DMF (300 mL) was slowly added a solution of N-bromosuccinimide (138.2 g, 0.78 mol) in DMF (300 mL) while maintaining a reaction temperature of less than 50° C. The reaction solution was concentrated under reduced pressure, then was added to 300 mL of water to precipitate the product. The gray-colored solid was recrystallized in ethanol to afford off-white crystals. The crystals were collected and dried in a vacuum oven overnight to afford 135.4 g (85 percent). $^1H$ and $^{13}C$ NMR spectra were consistent with the structure of the desired product as follows.

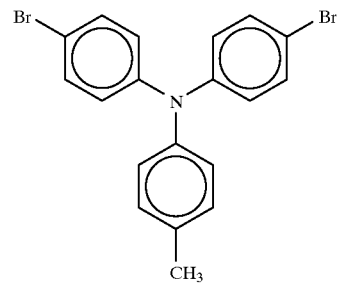

EXAMPLE 12

Preparation of N,N-di-(4-benzeneboronic acid)-p-tolylamine

The procedure of Example 9 was repeated with the following reagents: N,N-di-(4-bromophenyl)-p-tolylamine (4.17 g, 0.01 mol), magnesium turnings (0.58 g, 0.023 mol), THF (24 mL), and trimethylborate (2.8 g, 0.027 mol in 15 mL of THF). After work-up, a brown solid was isolated. The brown solid was crushed to a powder, added to 150 mL of 3N NaOH solution and stirred for 30 minutes and was then filtered. The filtrate was acidified with concentrated HCl, precipitating the product. The white precipitate was collected in a funnel. $^1H$ and $^{13}C$ NMR spectra were consistent with the following structure.

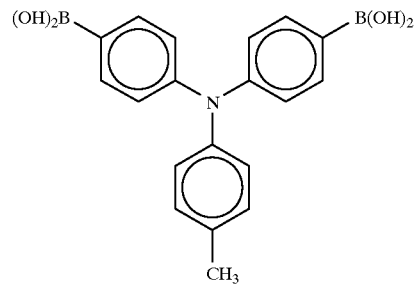

The product seemed to hydrolyze readily to N,N-diphenyltolylamine and boric acid.

EXAMPLE 13

Preparation of N,N'-diphenyl-N,N'-di-(4-pentoxyphenyl)benzidine

To a reactor was added N,N'-diphenylbenzidine (13.5 g, 0.04 mol), 4-iodophenylpentylether (29.0 g, 0.1 mol), copper bronze powder (8.9 g, 0.14 mol), powdered potassium carbonate (38.5 g, 0.28 mol), 18-crown-6-ether (1.8 g, 0.007 mol), and 1,2-dichlorobenzene (100 mL). With a slow purge of nitrogen through the condenser, the stirred reaction was heated to 180° C. for 90 hours. The hot reaction mixture was filtered through a bed of filter aid and the filtrate was concentrated under reduced pressure to afford a dark brown viscous liquid which was purified by silica gel flash column chromatography (25 percent toluene in hexane as eluent) to give 25.1 g (95 percent) of a white solid. $^1H$ and $^{13}C$ NMR spectra were consistent to the following structure.

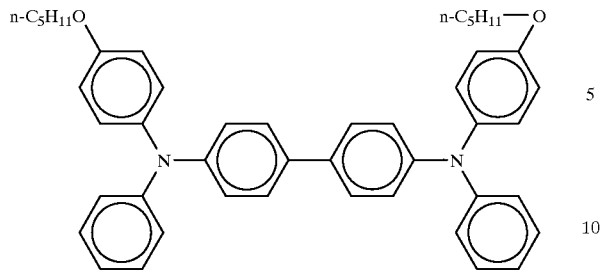
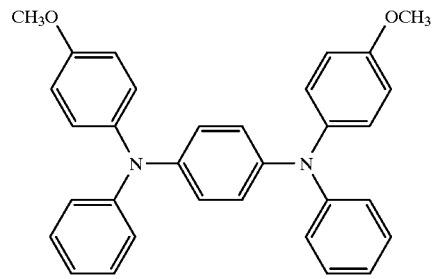

EXAMPLE 14

Preparation of N,N'-diphenyl-N,N'-di-(4-pentoxyphenyl)-1,4-phenylenediamine

The procedure of Example 13 was repeated with the following reagents: N,N'-diphenyl-1,4-phenylenediamine (11.0 g, 0.04 mol), 4-iodophenylpentylether (29.0 g, 0.1 mol), copper bronze powder (8.9 g, 0.14 mol), potassium carbonate (38.5 g, 0.28 mol), 18-crown-6-ether (1.8 g, 0.007 mol), and 1,2-dichlorobenzene (100 mL). After 72 hours, the hot reaction mixture was filtered through a bed of filter aid and concentrated under reduced pressure to afford dark-brown, viscous liquid which was percolated through a bed of silica gel with hexane to remove some of the color. Recrystallization from ethanol/acetone afforded 19.3 g (60 percent) of a tan-colored solid. $^1$H and $^{13}$C NMR spectra were consistent with the following structure.

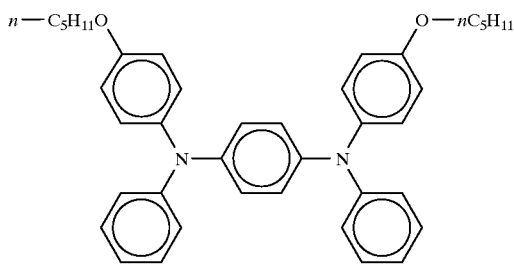

Cyclic voltammogram of the product (0.2M tetrabutylammonium perchlorate in dichloromethane, referenced to Ag/AgCl electrode) indicated reversible oxidation potentials of +0.39V and +0.84V.

EXAMPLE 15

Preparation of N,N'-diphenyl-N,N'-di-(4-methoxyphenyl)-1,4-phenylenediamine

The procedure of Example 13 was repeated with the following reagents: N,N'-diphenyl-1,4-phenylenediamine (46.3 g, 0.18 mol), 4-iodophenylmethylether (100.0 g, 0.43 mol), copper bronze powder (28 g, 0.44 mol), potassium carbonate (166 g, 1.2 mol), 18-crown-6 ether (7.9 g, 0.03 mol), and 1,2-dichlorobenzene (400 mL). After 24 hours, the hot reaction mixture was filtered through a bed of filter aid and concentrated under reduced pressure to afford dark-brown, viscous liquid which was percolated through a bed of silica gel with hexane to remove some of the color. Recrystallization twice from acetone afforded 55.7 g (66 percent) of a tan-colored crystal. $^1$H and $^{13}$C NMR spectra were consistent with the following structure.

EXAMPLE 16

Preparation of N,N'-diphenyl-N,N'-di-(4-methylphenyl)benzidine

The procedure of Example 13 was repeated with the following reagents: N,N'-diphenyl-1,4-phenylenediamine (4.85 g, 0.014 mol), 4-iodotoluene (9.43 g, 0.043 mol), copper bronze powder (3.8 g, 0.06 mol), potassium carbonate (16.6 g, 0.12 mol), 18-crown-6-ether (0.78 g, 0.003 mol), and 1,2-dichlorobenzene (50 mL). After 40 hours, the hot reaction mixture was filtered through a bed of filter aid and the filtrate was concentrated under reduced pressure to afford a dark-brown oil which became a semi-solid upon standing. The product was purified by silica gel flash column chromatography with 10 percent toluene in hexane to yield a white solid (5.75 g, 77 percent). $^1$H and $^{13}$C NMR spectra were consistent with the structure of the following structure.

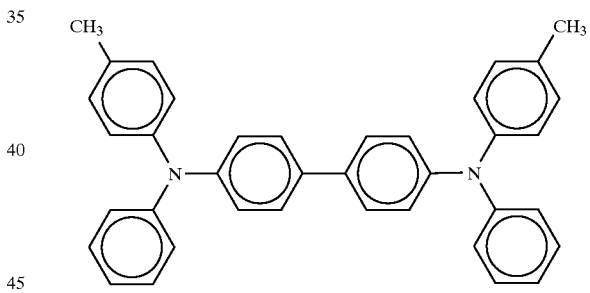

A cyclic voltammogram of the product as described in Example 14 indicated reversible oxidation potentials of +0.68V and +0.81V.

EXAMPLE 17

Preparation of N,N'-di-(4-bromophenyl)-N,N'-di-(4-methylphenyl)benzidine

To a stirred solution of N,N'-diphenyl-N,N'-di-(4-methylphenyl)benzidine (5.7 g, 0.001 mol) in THF (15 mL) and DMF (10 mL) was slowly added (about 15 minutes) a solution of N-bromosuccinimide (4.0 g, 0.001 mol) in DMF (10 mL). The reaction solution was concentrated under reduced pressure and then added to 10 percent aqueous ethanol, precipitating out a white solid. The white solid was collected and dried in a vacuum oven overnight to afford 6.7 g (91 percent). $^1$H and $^{13}$C NMR spectra were consistent with the following structure.

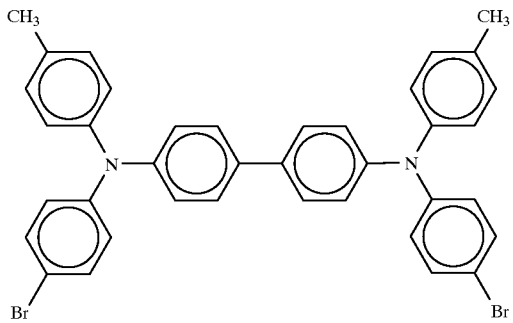
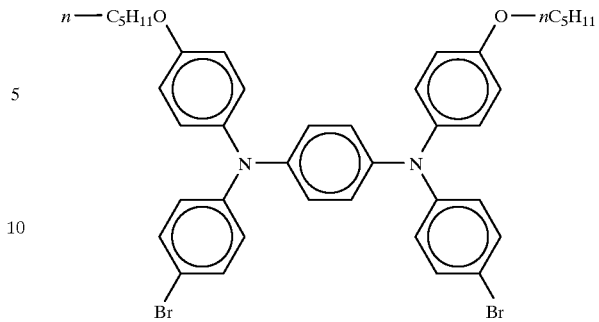

EXAMPLE 18

Preparation of N,N'-di-(4-bromophenyl)-N,N'-di-(4-pentoxyphenyl)benzidine

The procedure of Example 17 was repeated with the following reagents: N,N'-diphenyl-N,N'-di-(4-pentoxyphenyl)benzidine (24.9 g, 0.038 mol) in DMF (200 mL), N-bromosuccinimide (13.4 g, 0.076 mol), and DMF (100 mL). The reaction solution was concentrated under reduced pressure and then added to 50 percent aqueous ethanol, precipitating out a grayish solid which was collected and dried in a vacuum oven at ambient temperature overnight. The yield was 30.6 g (99 percent). $^{1}$H and $^{13}$C NMR spectra were consistent with the following structure.

EXAMPLE 20

Preparation of N,N'-di-(4-bromophenyl)-N,N'-di-(4-methoxyphenyl)-1,4-phenylenediamine The procedure of Example 17 was repeated with the following reagents: N,'-diphenyl-N,N'-di-(4-methoxyphenyl)-1,4-phenylenediamine (25.0 g, 0.053 mol) in DMF (150 mL), N-bromosuccinimide (19.0 g, 0.11 mol), and DMF (150 mL). The reaction mixture was added to one liter of toluene and heated to 60° C. The warm solution was washed with water (4×1000 mL) at 60° C. The toluene solution was dried over anhydrous MgSO$_4$, filtered through a bed of silica gel, then concentrated under reduced pressure. Two recrystallizations of the crude product from toluene/hexane gave tan-colored crystals (21.6 g, 65 percent) after

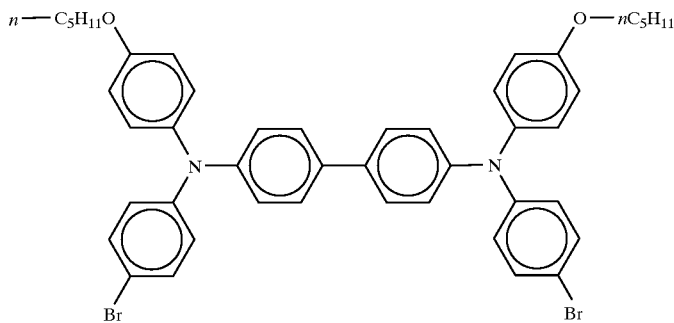

EXAMPLE 19

Preparation of N,N'-di-(4-bromophenyl)-N,N'-di-(4-pentyloxyphenyl)-1,4-phenylenediamine The procedure of Example 17 was repeated with the following reagents: N,N'-diphenyl-N,N'-di-(4-pentoxyphenyl)-1,4-phenylenediamine (14.0 g, 0.024 mol) in THF (150 mL), N-bromosuccinimide (9.0 g, 0.051 mol), and DMF (100 mL). Three recrystallizations of the crude product from acetone gave tan-colored crystals (10.8 g, 60 percent). $^{1}$H and $^{13}$C NMR spectra were consistent with the following structure.

drying. $^{1}$H and $^{13}$C NMR spectra were consistent with the following structure.

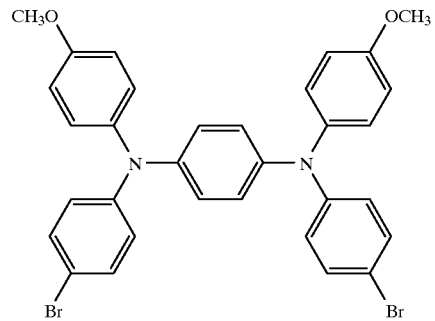

EXAMPLE 21

Coupling of 4-benzocyclobuteneboronic acid with N,N'-di-(4-bromophenyl)-p-tolylamine To a reactor was added N,N'-di-(4-bromophenyl)-p-tolylamine (4.17 g, 0.01 mol), 2N aqueous sodium carbonate solution (10 mL), 4-benzocyclobuteneboronic acid (5.92 g, 0.04 mol), toluene (20 mL), and ethanol (20 mL). The reactor was purged with nitrogen for 10 minutes, then to it was added tetrakis(triphenylphosphine)-palladium (0) (0.4 g). The reaction mixture was heated to gentle reflux for 20 hours with vigorous stirring. The reaction mixture was added to a separatory funnel together with 100 mL of water. The mixture was extracted with ether (2×250 mL). The combined ether layer was washed with 3N NaOH solution (2×150 mL), water (2×150 mL), dried over anhydrous MgSO$_4$, then concentrated on a roto-evaporator. The product was purified by silica gel flash column chromatography with hexane to afford a white solid (2.2 g). $^1$H and $^{13}$C NMR spectra were consistent with the following structure.

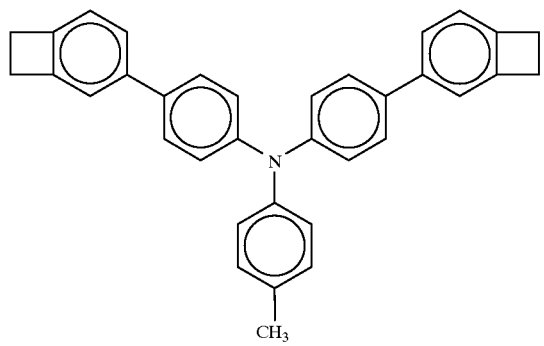

A homogeneous film of the material is obtained by spin-coating from a toluene solution at 2500 rpm for 90 seconds. The film was cured according to the following schedule: Nitrogen purge at ambient temperature for 30 minutes; heat to 250° C. at the rate of 3° C./minute; hold at 250° C. for 2 hours; cool to ambient temperature. The cured film examined under the microscope showed that the film had puddled. A 1.5 g sample of the material was B-staged under vacuum at 190° C. for 3 hours. DSC analysis of the B-staged material showed that 40 percent of the BCB units had reacted. A film of the B-staged material spin-coated from toluene solution has the same UV absorption as that of the monomer. The photoluminescent spectra were taken of the film from the B-staged oligomer and the B-staged oligomer in chloroform. The film was then cured according to the above cure schedule. Analysis of the film by microscope showed that the integrity of the film was maintained and no puddle effect was seen. The cured film was resistant to chloroform.

EXAMPLE 22

Coupling of 4-benzocyclobuteneboronic acid with N,N'-di-(4-bromophenyl)-N,N'-di-(4-methylphenyl)benzidine Example 21 was repeated with N,N'-di-(4-bromophenyl)-N,N'-di-(4-methylphenyl)benzidine (3.3 g, 0.005 mol), toluene (20 mL), 2N aqueous sodium carbonate solution (10 mL), tetrakis(triphenylphosphine)-palladium (0) (0.175 g) and 4-benzocyclobuteneboronic acid (3.0 g, 0.02) dissolved in a minimum amount of ethanol. The product was a white solid (2.0 g). $^1$H and $^{13}$C NMR spectra were consistent with the following structure.

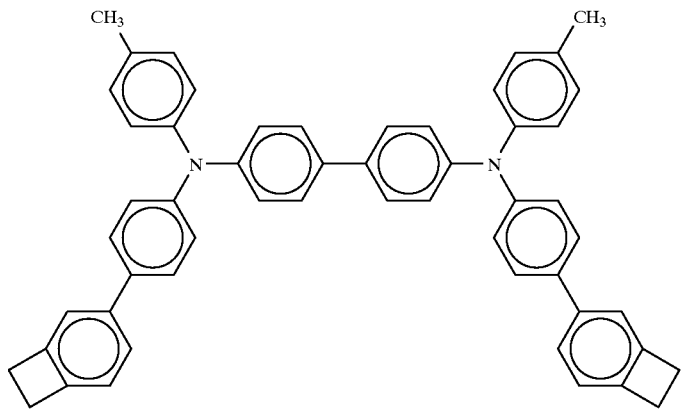

The material in the solid state has a strong UV absorption (λ max 336 nm) and a photoluminescence peak at 419 nm. Cyclic voltammogram of the product (0.2M tetrabutylammonium perchlorate in dichloromethane, referenced to Ag/AgCl electrode) indicated an E1ox=+0.63V (rev) and E2ox=+0.83V (rev).

A film of the material is obtained by spin-coating from a toluene solution (2500 rpm for 90 seconds). The film was cured according to the schedule in Example 21. The cured film examined under the microscope showed that the resin had formed puddles during cure. A 1.5 g sample of the material was B-staged under vacuum at 190° C. for 3 hours. DSC analysis of the B-staged material shows that 36 percent of the BCB units had reacted. A film of the B-staged material spin-coated from toluene solution was cured according to the schedule in Example 21. Analysis of the film by microscope showed a uniform film without puddles. The cured film was resistant to chloroform. Cyclic voltammogram of the cured film has a E1ox=+0.75V (rev); E2ox=+0.86V (rev). The cured film has a UV absorption with λ max 333 nm.

EXAMPLE 23

Coupling of 4-benzocyclobuteneboronic acid with N,N'-di-(4-bromophenyl)-N,N'-di-(4-pentyloxyphenyl)benzidine Example 21 was repeated with N,N'-di-(4-bromophenyl)-N,N'-di-(4-pentyloxyphenyl)benzidine (4.9 g, 0.006 mol), toluene (20 mL), 2N aqueous sodium carbonate solution (10 mL), tetrakis(triphenylphosphine)-palladium (0) (0.175 g) and 4-benzocyclobuteneboronic acid (3.0 g, 0.02 mol). The product was a dark-brown, glassy solid. The solid was redissolved in 200 mL of toluene. To the toluene solution was added 100 mL of water and 50 mL of ethylenediamine. The mixture was heated to 60° C. with vigorous stirring for 2.5 hours. The aqueous layer was removed and the toluene layer was washed with water (2×150 mL), dried over anhydrous $MgSO_4$ and concentrated under reduced pressure. The product was isolated by flash column chromatography on silica gel. $^1H$ and $^{13}C$ NMR spectra were consistent with the following structure.

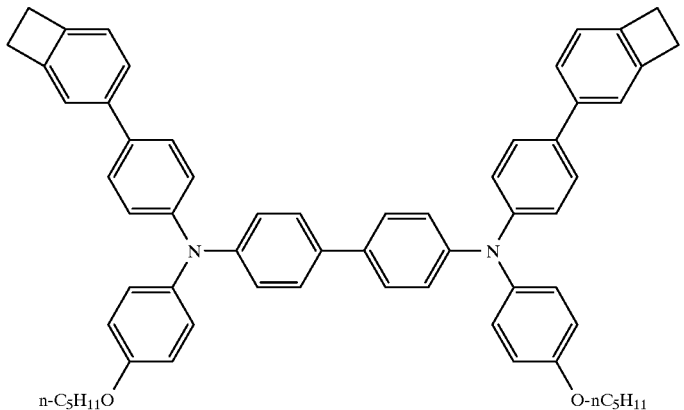

The material in the solid state has a strong UV absorption (λ max 367 nm) and a solution (chloroform) absorption of 364 nm. The material in the solid state has a photoluminescent peak at 423 nm and a solution (chloroform) emission at 421 nm. DSC analysis of the product showed a sharp endothermic peak at 72° C. corresponding to melting and a broad exothermic peak starting at 190° C. with a maximum at 259° C. corresponding to curing reaction of BCB. DSC rescan of the sample showed a glass transition at 275° C.

The material was B-staged under vacuum at 190° C. for 3 hours. DSC analysis of the B-staged material showed a Tg of 97° C. and that 36 percent of the BCB units had reacted. A film of the B-staged material spin-coated from toluene solution was cured according to the schedule in Example 21.

Analysis by microscope showed a smooth and homogeneous film whose photoluminescent spectrum showed a broad emission at 489 nm.

EXAMPLE 24

Coupling of 4-(t-butyldimethylsilyloxy)-benzeneboronic acid with N,N'-di-(4-bromophenyl)-N,N'-di-(4-pentoxyphenyl)benzidine The procedure of Example 21 was repeated with the following reagents: N,N'-di-(4-bromophenyl)-N,N'-di-(4-pentoxyphenyl)benzidine (8.2 g, 0.01 mol), 2N aqueous sodium carbonate solution (10 mL), toluene (20 mL), tetrakis(triphenylphosphine)-palladium (0) (0.4 g), and 4-(t-butyl-dimethylsilyloxy)benzeneboronic acid (7.6 g, 0.03 mol). The reaction mixture was added to a separatory funnel, together with 100 mL of water. The mixture was extracted with ether (400 mL). The ether layer was washed with 3N NaOH solution (150 mL), water (2×300 mL), dried over anhydrous $MgSO_4$, then concentrated on a roto-evaporator to afford a brown oil. High pressure liquid chromatographic (HPLC) analysis indicated a minor and two major components. Based on mass spectrometry analysis, the proposed structures of the three components are as follows.

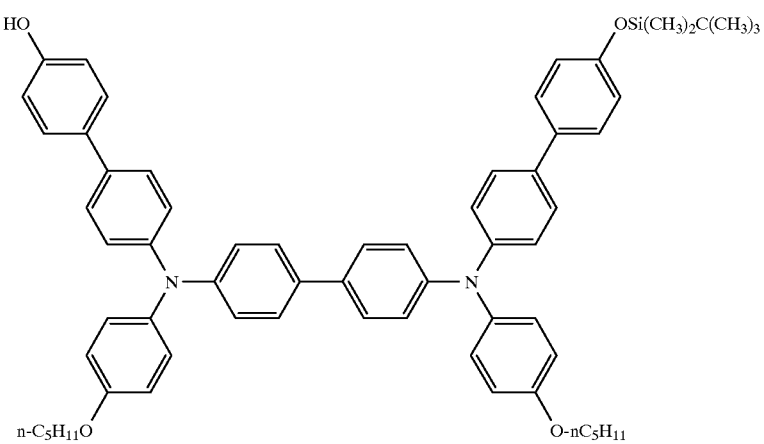

42%

-continued

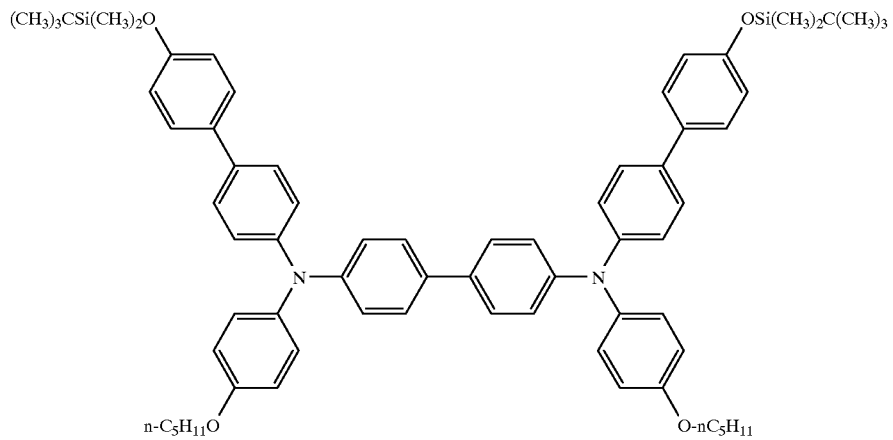

50%

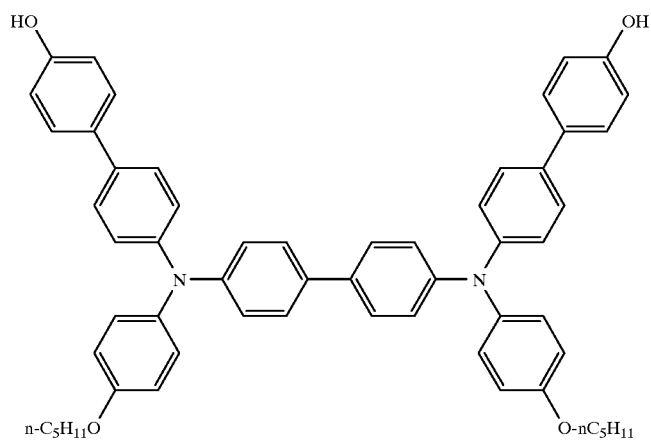

3%

EXAMPLE 25

Coupling of 4-(t-butyldimethylsilyloxy)-benzeneboronic acid with N,N'-di-(4-bromophenyl)-N,N'-di-(4-pentoxyphenyl)-1,4-phenylenediamine The procedure of Example 21 was repeated with the following reagents: N,N'-di-(4-bromophenyl)-N,N'-di(4-pentoxyphenyl)-1,4-phenylenediamine (7.4 g, 0.01 mol), 2N aqueous sodium carbonate solution (10 mL), toluene (20 mL), tetrakis(triphenylphosphine)-palladium (0) (0.4 g), and 4-(t-butyldimethylsilyloxy)-benzeneboronic acid (7.6 g, 0.03 mol). The same work-up procedure afforded a brown oil (10.2 g). HPLC analysis of the crude product indicated three components. Based on the mass spectrometry analysis, the proposed structures of the three components are as follow.

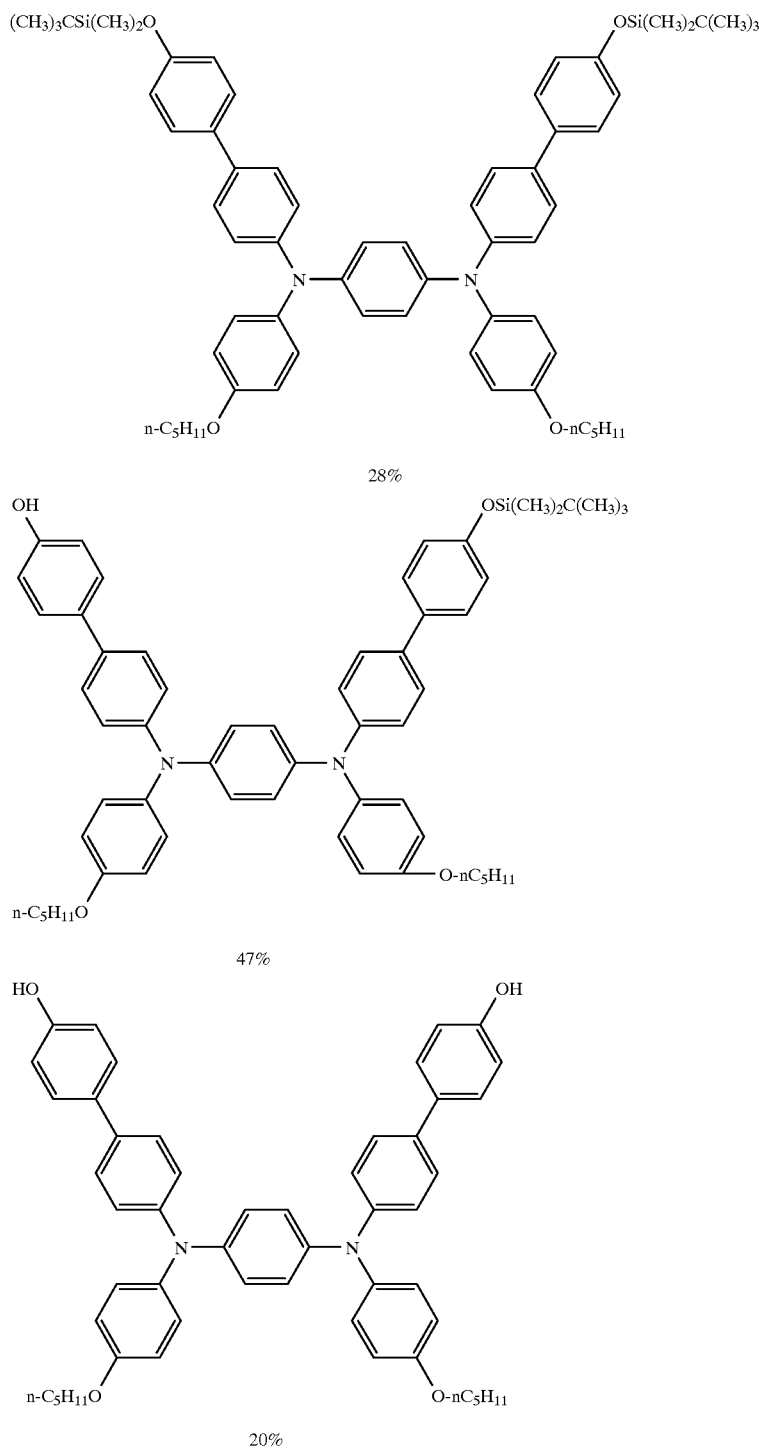

28%

47%

20%

EXAMPLE 26

Preparation of N,N'-di-4(4'-hydroxybiphenyl)-N,N'-di-(4-pentoxyphenyl)benzidine

The crude reaction product from Example 24 was dissolved in 100 mL of 2 percent HCl in THF solution. The solution was stirred at ambient temperature for four days. Reaction solution was added to 300 mL of ether in a separatory funnel then washed with water (2×150 mL), saturated NaHCO$_3$ solution (150 mL), then again with water (2×150 mL). The ether layer was dried over anhydrous MgSO$_4$ then concentrated on a roto-evaporator to afford 10.5 g of a dark-brown, viscous liquid with some crystals. The product was isolated by flash column chromatography over silica gel with 5 percent (v/v) ethyl acetate in toluene to afford 6.0 g of light-brown crystals (71 percent based on N,N'-di-(4-bromophenyl)-N,N'-di-(4-pentoxyphenyl)-benzidine). $^1$H and $^{13}$C NMR spectra were consistent with the structure as follows.

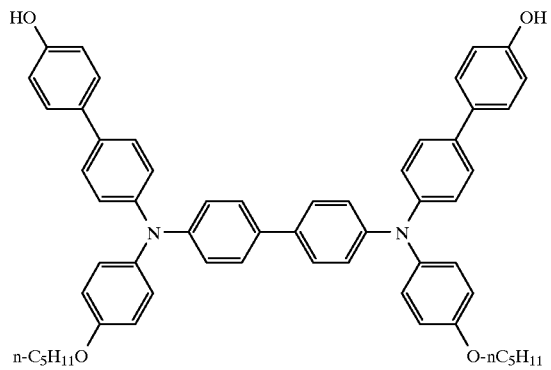

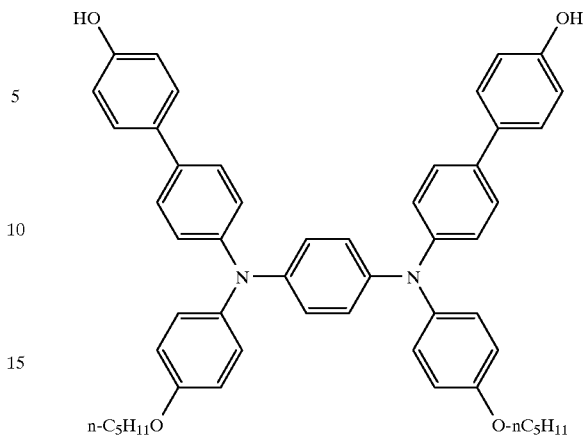

EXAMPLE 27

Preparation of N,N'-di-4(4'-hydroxybiphenyl)-N,N'-di-(4-pentoxyphenyl)-1,4-phenylenediamine The crude reaction product from Example 25 was dissolved in 100 mL of 5 percent HCl in THF solution. The solution was stirred at ambient temperature for 23 hours. Reaction solution was added to 300 mL of ether in a separatory funnel then washed with water (2×150 mL), saturated NaHCO$_3$ solution (150 mL), then again with water (2×150 mL). The ether layer was dried over anhydrous MgSO$_4$ then concentrated on a roto-evaporator to afford a dark-brown, viscous liquid with some crystals. Product was isolated by flash column chromatography over silica gel with 7 percent (v/v) ethyl acetate in toluene to afford 3.5 g of light-brown crystals (46 percent base on N,N'-di-(4-bromophenyl)-N,N'-di(4-pentoxyphenyl)-1,4-phenylenediamine; low yield was mostly due to loss from spillage). $^1$H and $^{13}$C NMR spectra were consistent with the following structure.

EXAMPLE 28

Diacrylate of N,N'-di-4(4'-hydroxybiphenyl)-N,N'-di-(4-pentoxyphenyl)benzidine

A solution of acryloyl chloride (0.52 g, 5.6 mmol) in 5.0 mL of methylene chloride was slowly added to a solution of N,N'-di-4(4'-hydroxybiphenyl)-N,N'-di-(4-pentoxyphenyl) benzidine (2.0 g, 2.4 mmol) and triethylamine (0.95 g, 95 mmol) in 20 mL of methylene chloride. The solution was stirred at ambient temperature for 10 minutes. Crude reaction solution was concentrated under reduced pressure to dryness then redissolved in 200 mL of ether. The ether solution was washed with water (3×150 mL), dried over anhydrous MgSO$_4$, and concentrated on the roto-evaporator to afford a yellow, glassy solid. The glassy solid was dissolved in a minimum amount of toluene. The toluene solution was added to methanol, precipitating a yellow solid. The precipitate was collected and dried in a vacuum oven overnight to afford a pale yellow solid (2.0 g, 87 percent). $^1$H and $^{13}$C NMR spectra were consistent with the following structure.

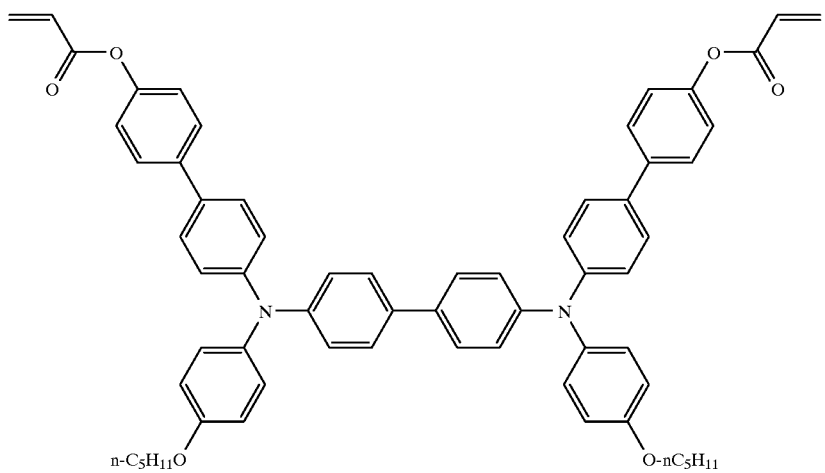

DSC analysis showed a sharp endothermic peak at 74° C. corresponding to melting and a broad exothermic peak starting at 200° C. with a maximum at 261° C., and a small exothermic transition at 160° C. DSC rescan of the sample showed no transition up to 325° C. Cyclic voltammogram of the product (0.2M tetrabutylammonium perchlorate in dichloromethane, referenced to Ag/AgCl electrode) indicated an E1ox=+0.61V (rev) and E2ox=+0.80V (rev). A film of the material was obtained by spin-coating from toluene solution. It had a strong UV absorption ($\lambda$ max 364 nm) and a photoluminescence peak at 425 nm. A film cured in nitrogen for 8 hours at 185° C. showed absorption and photoluminescence behavior identical to those of an uncured film.

The diacrylate was blended with 1.5 weight percent of 2,2-dimethoxy-2-phenylacetophenone and 7.5 weight percent of trimethylolpropane triacrylate in toluene to afford a 2 percent (wt/v) solution. Films were cured in a UVP mid-range ultraviolet crosslinker model CL-1000 for 15 minutes at 200 mJ/cm². The cured film was resistant to toluene. Cyclic voltammogram of the cured film indicated an E1ox=+0.70V (rev); E2ox=+0.77V (rev).

EXAMPLE 29

Preparation of a diacrylate of N,N'-di-4(4'-hydroxybiphenyl)-N,N'-di-(4-pentoxyphenyl)-1,4-phenylenediamine Example 28 was repeated with the following reagents: acryloyl chloride (0.50 g, 5.5 mmol) in 5.0 mL of methylene chloride, N,N'-di-4(4'-hydroxybiphenyl)-N,N'-di-(4-pentoxyphenyl)-1,4-phenylenediamine (1.7 g, 2.2 mmol), and triethylamine (0.90 g, 90 mmol) in 20 mL of methylene chloride. $^1$H and $^{13}$C NMR spectra were consistent with the following structure.

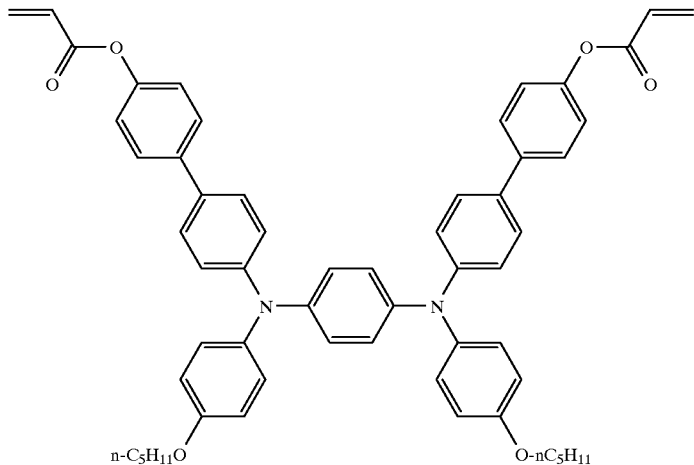

DSC analysis showed a sharp endothermic peak at 170° C. due to melting and a broad exothermic peak starting at 225° C. with a maximum at 279° C. DSC rescan of the sample showed no transition up to 300° C. Cyclic voltammogram of the product (0.2M tetrabutylammonium perchlorate in dichloromethane, referenced to Ag/AgCl electrode) indicated E1ox=+0.40V and E2ox=+0.82V.

The diacrylate was blended with 1.5 weight percent of 2,2-dimethoxy-2-phenylacetophenone and 7.5 weight percent of trimethylolpropane triacrylate in toluene to afford a 2 percent (wt/v) solution. Films were cured in a UVP mid-range ultraviolet crosslinker model CL-1000 for 15 minutes at 200 mJ/cm². The cured film was resistant to toluene.

TABLE 1

| Example | 3 | 4 | 7 | 21 |
|---|---|---|---|---|
| Ratio[1] Uncured Polymer | 4.7 | 4.9 | 2.8 | |
| DSC Peak ° C.[2] | 200/261 | 210/260 | 200/257 | |
| UV Absorption Peak nm | 364 | 366 | | 331/246 |
| Photoluminescent Peak nm | 420 | 422 | | 423 |
| Oxidation Potential Volt | +0.60/+0.88 | +0.59/+0.81 | | +0.76 |
| Cured film UV Absorption Peak nm | 354 | 358 | 345 | 331[4] |
| Photoluminescent Peak nm[3] | 490/420 | 490/422 | 492/422 | 433/460[4] 419[5] |
| Oxidation Potential Volt | +0.61/+0.88 | +0.61/+0.89 | +0.84 | +0.86[6] |

[1]Ratio of tertiary amine to haloaromatic compound.
[2]Beginning of peak/peak maximum.
[3]Major peak/minor peak.
[4]Film from B-staged oligomer, 40 percent cured.
[5]B-staged oligomer in chloroform.
[6]Film from B-staged material which is finally cured.

What is claimed is:

1. A composition comprising at least one compound corresponding to Formula (I) or (II);

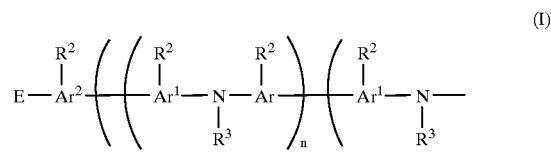

-continued

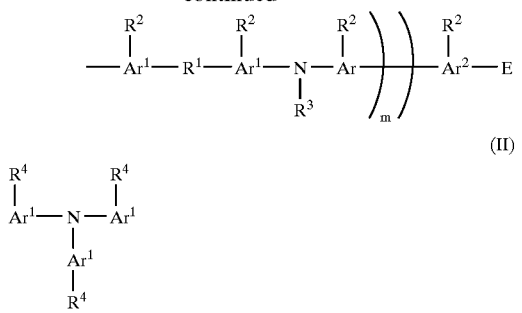

(II)

$$Ar^1-N(R^4)(Ar^1)-Ar^1-R^4$$ with Ar^1 branch (III)

wherein:

E is independently in each occurrence a hydroxy, glycidyl ether, acrylate ester, methacrylate ester, ethenyl, ethynyl, vinylbenzyloxy, maleimide, nadimide, trifluorovinyl ether, a cyclobutene bound to adjacent carbons on $Ar^2$, or a trialkylsiloxy;

$Ar^1$ and $Ar^2$ are independently in each occurrence a di- or multivalent $C_{6-18}$ aryl moiety or a di- or multivalent $C_{4-17}$ aryl moiety containing one or more heteroatoms of nitrogen, oxygen or sulfur;

$R^1$ is independently in each occurrence a single bond; sulfur; oxygen; $C_{1-20}$ divalent hydrocarbyl; a divalent silyl or a polysilyl moiety having a $C_{1-10}$ hydrocarbyl; a $C_{1-20}$ divalent hydrocarbyl further containing one or more of oxygen, sulfur, an arylamine, a carbonyl, a carbonyloxy, an amide, sulfinyl, sulfonyl, an aryl phosphinyl, or an aryl phosphine oxide; or a $C_{1-20}$ hydrocarbyl-substituted siloxy or polysiloxy;

$R^2$ is independently in each occurrence $C_{1-20}$ hydrocarbyl, $C_{1-20}$ hydrocarbyloxy, hydrocarbyl thioether, $C_{1-20}$ hydrocarbyl sulfonyl, $C_{1-20}$ hydrocarbyl sulfinyl, or two adjacent $R^2$ bonded to two aromatic rings which are bonded to the same nitrogen atom may form a direct bond between the two aromatic rings or be bonded to a divalent sulfur or oxygen;

$R^3$ is independently in each occurrence a $C_{1-20}$ hydrocarbyl moiety or a moiety corresponding to the formula —$Ar^1(R^2)$—$Ar^2$—E;

$R^4$ is independently in each occurrence hydrogen, a $C_{1-20}$ hydrocarbyl moiety, —$Ar^2(R^2)$—E or a moiety corresponding to Formula (III)

(III)

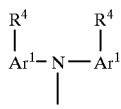

with the proviso that each poly(tertiary di- or polyarylamine) contains two or more units which are —$Ar^2(R^2)$—E;

m is a number of from about 0 to about 50; and n is a number of from about 1 to about 50.

2. A composition according to claim 1 wherein:

$Ar^1$ and $Ar^2$ are independently in each occurrence derived from benzene, naphthalene, anthracene, phenanthracene, pyridine, thiophene, pyrrole, furan, diazine or oxazine;

E is a hydroxy, glycidyl ether, acrylate ester, methacrylate ester, ethenyl, ethynyl, maleimide, vinylbenzyloxy, nadimide, trifluorovinyl ether, a cyclobutene bound to adjacent carbon atoms on $Ar^2$, or a trialkylsiloxy;

$R^1$ is independently in each occurrence a single bond, sulfur, oxygen or a $C_{1-20}$ divalent hydrocarbyl;

$R^2$ is independently in each occurrence $C_{1-20}$ hydrocarbyl or two adjacent $R^2$ bonded to two aromatic rings which are bonded to the same nitrogen atom may form a direct bond between the two aromatic rings or be bound to a divalent sulfur or divalent oxygen;

$R^3$ is independently in each occurrence a $C_{1-20}$ alkyl, or $C_{6-18}$ aryl moiety or a moiety corresponding to the formula —$Ar^1(R^2)$—$Ar^2$—E; and $R^4$ is independently in each occurrence hydrogen, a $C_{1-10}$ alkyl moiety, —$Ar^2(R^2)$—E or a moiety corresponding to Formula (III), (III)

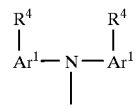

with the proviso that two or more units of each poly(tertiary di- or polyarylamine) are —$Ar^2(R^2)$—E.

3. A composition according to claim 2 wherein:

$Ar^1$ and $Ar^2$ are derived from benzene;

E is a hydroxy, glycidyl ether, acrylate ester, methacrylate ester, ethenyl, ethynyl, maleimide or a cyclobutene bound to adjacent carbon atoms on $Ar^2$;

$R^1$ is independently in each occurrence a single bond, sulfur, oxygen or a divalent benzene moiety;

$R^2$ is independently in each occurrence $C_{1-10}$ alkyl or two adjacent $R^2$ bonded to two aromatic rings which are bonded to the same nitrogen atom may form a direct bond between the two aromatic rings or are bound to a divalent sulfur or oxygen;

$R^3$ is independently in each occurrence a phenyl or a moiety corresponding to the formula —$Ar^1(R^2)$—$Ar^2$—E; and $R^4$ is independently in each occurrence hydrogen, a methyl, —$Ar^2(R^2)$—E or a moiety corresponding to Formula (III) with the proviso that each poly(tertiary di- or polyarylamine) contains two or more units which are —$Ar^2(R^2)$—E.

4. A composition according to claim 1 comprising at least one compound corresponding to Formula (I).

5. A composition according to claim 4 wherein:

$Ar^1$ and $Ar^2$ are independently in each occurrence derived from benzene, naphthalene, anthracene, phenanthracene, pyridine, thiophene, pyrrole, furan, diazine or oxazine;

E is a hydroxy, glycidyl ether, acrylate ester, methacrylate ester, ethenyl, ethynyl, maleimide, vinylbenzyloxy, nadimide, trifluorovinyl ether, a cyclobutene bound to two adjacent carbon atoms on $Ar^2$ or a trialkylsiloxy;

$R^1$ is independently in each occurrence a single bond, sulfur, oxygen or a $C_{1-20}$ divalent hydrocarbyl;

$R^2$ is independently in each occurrence $C_{1-20}$ hydrocarbyl or two adjacent $R^2$ bonded to two aromatic rings which are bonded to the same nitrogen atom may form a direct bond between the two aromatic rings or be bonded to a divalent sulfur or oxygen; and $R^3$ is independently in each occurrence a $C_{1-20}$ alkyl, or $C_{6-18}$ aryl moiety or a moiety corresponding to the formula —$Ar^1(R^2)$—$Ar^2$—E.

6. A composition according to claim 1 comprising at least one compound corresponding to Formula (II).

7. A composition according to claim 6 wherein:

$Ar^1$ is independently in each occurrence derived from benzene, naphthalene, anthracene, phenanthracene, pyridine, thiophene, pyrrole, furan, diazine or oxazine;

E is a hydroxy, glycidyl ether, acrylate ester, methacrylate ester, ethenyl, ethynyl, maleimide, vinylbenzyloxy, nadimide, trifluorovinyl ether, a cyclobutene bound to adjacent carbon atoms on $Ar^2$ or a trialkylsiloxy; and $R^4$ is independently in each occurrence hydrogen, a $C_{1-10}$ alkyl moiety, —$Ar^2(R^2)$—E or a moiety corresponding to Formula (III)

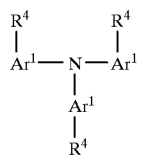

(III)

with the proviso that each poly(tertiary di- or polyarylamine) contains two or more units which are —$Ar^2(R^2)$—E.

8. A process for the preparation of a composition according to claim 1 which comprises contacting one or more tertiary di- or polyarylamines corresponding to one or more of Formulas (VII), (VIII) and (IX);

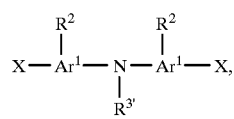

(VII)

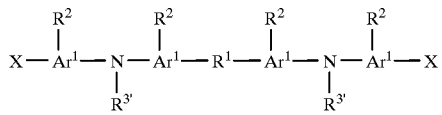

(VIII)

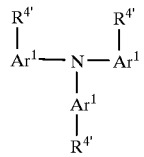

(IX)

with a haloaromatic compound having a reactive group which can crosslink or chain extension or a trialkylsiloxy moiety corresponding to the formula E—$Ar^2$—X in the presence of a catalytic amount of a divalent nickel salt, at least a stoichiometric amount of zinc-powder, a trihydrocarbylphosphine and an amount of a compound capable of accelerating the reaction in a polar solvent and an optional co-solvent comprising an aromatic hydrocarbon or ether under conditions such that one or more compounds according to Formula (I) or (II) is prepared,

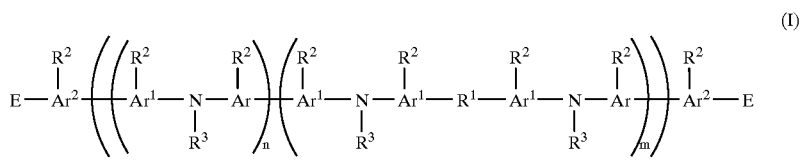

(I)

(II)

wherein:

E is independently in each occurrence a reactive group capable of undergoing chain extension or crosslinking or a trialkylsiloxy;

$Ar^1$ and $Ar^2$ are independently in each occurrence a di- or multivalent $C_{6-18}$ aryl moiety or a di- or multivalent $C_{4-17}$ aryl moiety containing one or more heteroatoms of nitrogen, oxygen or sulfur;

$R^1$ is independently in each occurrence a single bond; sulfur; oxygen; $C_{1-20}$ divalent hydrocarbyl; a divalent silyl or polysilyl moiety bearing $C_{1-10}$ hydrocarbyl; a $C_{2-20}$ divalent hydrocarbyl further containing one or more of oxygen, sulfur, an arylamine, a carbonyl, a carbonyloxy, an amide, sulfinyl, sulfonyl, an aryl phosphinyl, or an aryl phoshine oxide; or a $C_{1-20}$ hydrocarbyl-substituted siloxy or polysiloxy;

$R^2$ is independently in each occurrence $C_{1-20}$ hydrocarbyl, $C_{1-20}$ hydrocarbyloxy, $C_{1-20}$ hydrocarbyl thioether, $C_{1-20}$ hydrocarbyl sulfonyl, $C_{1-20}$ hydrocarbyl sulfinyl or two adjacent $R^2$ bonded to two aromatic rings which are bonded to the same nitrogen atom may form a direct bond between the two aromatic rings or be bonded to a divalent sulfur or divalent oxygen;

$R^{3'}$ is independently in each occurrence a $C_{20}$ hydrocarbyl moiety or —$Ar^1(R^2)$X;

$R^3$ is independently in each occurrence a $C_{1-20}$ hydrocarbyl moiety or a moiety corresponding to the formula —$Ar^1(R^2)$—$Ar^2$—E;

$R^{4'}$ is independently in each occurrence hydrogen, a $C_{1-20}$ hydrocarbyl moiety, X or a moiety corresponding to Formula (X),

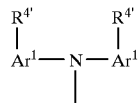

with the proviso that two units per molecule are X;

$R^4$ is independently in each occurrence hydrogen, a $C_{1-20}$ hydrocarbyl moiety, —$Ar^2(R^2)$—E or a moiety corresponding to the formula

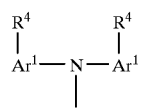

with the proviso that each poly(tertiary di- or polyarylamines) contains about two units which are —$Ar^2(R^2)$—E;

X is chlorine or bromine;

m is a number of from about 0 to about 50; and n is a number of from about 1 to about 50.

9. The process of claim 8 wherein

E is independently in each occurrence a hydroxy, a glycidyl ether, acrylate ester, methacrylate ester, ethenyl, ethynyl, maleimide, vinylbenzyloxy, nadimide, trifluorovinyl ether moiety or a cyclobutene bound to adjacent carbon atoms on $Ar^2$;

$Ar^1$ and $Ar^2$ are independently in each occurrence derived from benzene, naphthalene, anthracene, phenanthracene, pyridine, thiophene, pyrrole, furan, diazine or oxazine;

$R^1$ is independently in each occurrence a single bond, sulfur, oxygen or a $C_{1-20}$ divalent hydrocarbyl;

$R^2$ is independently in each occurrence $C_{1-20}$ hydrocarbyl or two adjacent $R^2$ bonded to two aromatic rings which are bonded to the same nitrogen atom may form a direct bond between the two aromatic rings or be bound to a divalent sulfur or oxygen;

$R^3$ is independently in each occurrence a $C_{1-20}$ alkyl, or $C_{6-18}$ aryl moiety or a moiety corresponding to the formula —$Ar^1(R^2)$—$Ar^2$—E;

$R^{3'}$ is independently in each occurrence a $C_{1-20}$ alkyl, $C_{6-18}$ aryl moiety or a moiety corresponding to the formula —$Ar^1(R^2)$X;

$R^4$ is independently in each occurrence hydrogen, a $C_{1-10}$ alkyl moiety, —$Ar^2(R^2)$—E or a moiety corresponding to Formula (III),

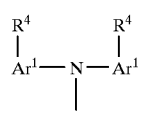

with the proviso that two or more units of each poly(tertiary di- or polyarylamine) are —$Ar^2(R^2$—E; and $R^{4'}$ is independently in each occurrence hydrogen, a $C_{1-10}$ alkyl moiety, X or a moiety corresponding to Formula (X),

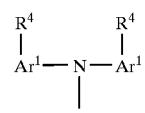

with the proviso that about two X are present on the tertiary di- or polyarylamine.

10. A process according to claim 9 wherein:

$Ar^1$ and $Ar^2$ are derived from benzene;

E is a hydroxy, glycidyl ether, acrylate ester, methacrylate ester, ethenyl, ethynyl, maleimide or a cyclobutene bound to adjacent carbon atoms on $Ar^2$;

$R^1$ is independently in each occurrence a single bond, sulfur, oxygen or a divalent benzene moiety;

$R^2$ is independently in each occurrence $C_{1-10}$ alkyl or two adjacent $R^2$ bonded to two aromatic rings which are bonded to the same nitrogen atom may form a direct bond between the two aromatic rings or are bound to a divalent sulfur or oxygen;

$R^3$ is independently in each occurrence a phenyl or a moiety corresponding to the formula —$Ar^1(R^2)$—$Ar^2$—E;

$R^{3'}$ is independently in each occurrence a phenyl or a moiety corresponding to the formula —$Ar^1(R^2)$—X;

$R^4$ is independently in each occurrence hydrogen, a methyl, —$Ar^2(R^2)$—E or a moiety corresponding to Formula (III)

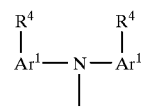

with the proviso that each poly(tertiary di- or polyarylamine) contains about two or more units which are —$Ar^2(R^2)$—E; and $R^{4'}$ is independently in each occurrence hydrogen, a methyl, X or a moiety corresponding to Formula (X),

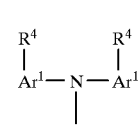

with the proviso that about two X are present on each tertiary di- or polyarylamine.

11. The process of claim 10 wherein the acrylate and methacrylate ester correspond to the formula

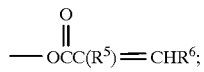

the ethenyl moiety corresponds to the formula

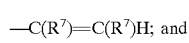

the benzocyclobutene corresponds to Formula (VI),

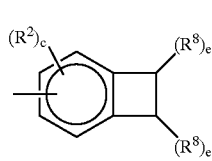
(VI)

wherein:
R$^2$ is independently in each occurrence C$_{1-20}$ alkyl, C$_{1-20}$ alkoxy, C$_{1-20}$ alkylthio, C$_{6-20}$ aryl, C$_{6-20}$ aryloxy, C$_{6-20}$ arylthio, C$_{7-20}$ aralkoxy, C$_{7-20}$ alkaryloxy, C$_{7-20}$ alkarylthio, C$_{7-20}$ aralkyl, C$_{7-20}$ aralkylthio, C$_{1-20}$ hydrocarbylsulfonyl or C$_{1-20}$ hydrocarbylsulfinyl;

R$^5$ is independently in each occurrence hydrogen or C$_{1-4}$ alkyl;

R$^6$ is independently in each occurrence hydrogen, C$_{1-20}$ hydrocarbyl or C$_{1-20}$ hydrocarbyloxy;

R$^7$ is independently in each occurrence hydrogen, C$_{1-20}$ hydrocarbyl or C$_{1-20}$ hydrocarbyloxy;

R$^8$ is independently in each occurrence C$_{1-20}$ alkyl or C$_{1-20}$ hydrocarbyloxy;

b is independently in each occurrence an integer of about 0 to about 3;

c is independently in each occurrence an integer of about 0 to about 3; and e is independently in each occurrence a number of from about 0 to about 2.

12. The process of claim 8 wherein the mole ratio of tertiary di- or polyarylamines to haloaromatic compound having a crosslinking or chain extension moiety or trialkylsiloxy is from about 0.5 to about 50, the divalent nickel salt is present in an amount of from about 0.01 to about 20 mole percent based on the amount of haloaromatic compound and tertiary di- or polyarylamine, the zinc powder is present in an amount of about 100 mole percent to about 300 mole percent based on the haloaromatic compound and tertiary di- or polyarylamine, the triarylphosphine is present in an amount of from about 10 to about 50 mole percent based on the haloaromatic compound and tertiary di- or polyarylamine and the amount of compound capable of accelerating the reaction is present from about 100 to about 150 mole percent based on the divalent salt.

13. The process of claim 12 wherein the solvent is dimethylformamide, dimethylacetamide, N-cyclohexyl-pyrrolidinone or N-methyl-pyrrolidinone and the process is performed in an inert atmosphere.

14. The process according to claim 13 wherein the product contains two or more trialkylsiloxyaryl moieties wherein the trialkylsiloxyaryl-substituted compounds are further contacted with acid in an organic solvent under conditions such that the trialkylsiloxyaryl moieties are converted to hydroxy moieties to prepare hydroxyaryl-substituted compounds.

15. A process according to claim 14 which further comprises contacting the hydroxyaryl-substituted compounds with a cyanogen halide in a chlorinated hydrocarbon, secondary alcohol or tertiary alcohol, in the presence of a tertiary amine under conditions such that cyanatoaryl-9-substituted compounds are prepared.

16. A process for the preparation of a composition according to claim 1 which comprises contacting one or more tertiary di- or polyarylamines corresponding to Formulae (XIII), (XIV) and (XV);

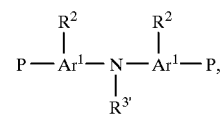
(XIII)

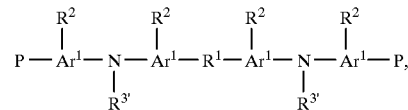
(XIV)

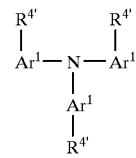
(XV)

with an aromatic compound having a reactive group which can crosslink or chain extension or a trialkylsiloxy moiety, corresponding to the formula E—Ar$^2$—Q in the presence of a catalytic amount of a zero valent palladium catalyst in the presence of heat or ultraviolet radiation under conditions such that one or more compounds according to one of Formulae (I) or (II) is prepared, (I)

$$E-Ar^2 \left(\left(-Ar^1-\underset{\underset{R^3}{|}}{N}-Ar-\right)_n \left(-Ar^1-\underset{\underset{R^3}{|}}{N}-\right.\right.$$
$$\left.\left.-Ar^1-R^1-Ar^1-\underset{\underset{R^3}{|}}{N}-Ar-\right)_m -Ar^2-E\right.$$

(II)

$$Ar^1-\underset{\underset{\underset{R^4}{|}}{\underset{Ar^1}{|}}}{N}-Ar^1$$

wherein:
E is independently in each occurrence a hydroxy, glycidyl ether, acrylate ester, methacrylate ester, ethenyl, ethynyl, vinylbenzyloxy, maleimide, nadimide, trifluorovinyl ether, a cyclobutene bound to adjacent carbons on Ar$^2$, or a trialkylsiloxy;

Ar$^1$ and Ar$^2$ are independently in each occurrence a di- or multivalent C$_{6-18}$ aryl moiety or a di- or multivalent C$_{4-17}$ aryl moiety containing one or more heteroatoms of nitrogen, oxygen or sulfur;

P is a boronic acid, chloro or bromo moiety,

Q is a boronic acid, chloro or bromo moiety, with the proviso that one of P or Q must be a boronic acid moiety and the other must be chloro or bromo;

R$^1$ is independently in each occurrence a single bond; sulfur; oxygen; C$_{1-20}$ divalent hydrocarbyl; a divalent silyl or polysilyl moiety bearing C$_{1-10}$ hydrocarbyl; a C$_{1-20}$ divalent hydrocarbyl further containing one or more of oxygen, sulfur, an arylamine, a carbonyl, a carbonyloxy, an amide, sulfinyl, sulfonyl, an aryl phosphinyl, an aryl phosphine oxide; or a $C_{1-20}$ hydrocarbyl-substituted siloxy or polysiloxy;

$R^2$ is independently in each occurrence $C_{1-20}$ hydrocarbyl, $C_{1-20}$ hydrocarbyloxy, $C_{1-20}$ hydrocarbyl thioether, $C_{1-20}$ hydrocarbyl sulfonyl, $C_{1-20}$ hydrocarbyl sulfinyl or two adjacent $R^2$ bonded to two aromatic rings which are bonded to the same nitrogen atom may form a direct bond between the two aromatic rings or are bonded to a divalent sulfur or oxygen;

$R^{3'}$ is independently in each occurrence a $C_{1-20}$ hydrocarbyl moiety —$Ar^1(R^2)X$;

$R^3$ is independently in each occurrence a $C_{1-20}$ hydrocarbyl moiety or a moiety corresponding to the formula —$Ar^1(R^2)$—$Ar^2$—E;

$R^{4'}$ is independently in each occurrence hydrogen, a $C_{1-20}$ hydrocarbyl moiety, X or a moiety corresponding to Formula (X),

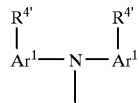

(X)

with the proviso that about two X are substituted on the tertiary di- or polyarylamines;

$R^4$ is independently in each occurrence hydrogen, a $C_{1-20}$ hydrocarbyl moiety, —$Ar^2(R^2)$—E or a moiety corresponding to Formula (III),

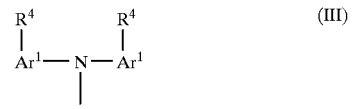

(III)

with the proviso that each of the poly(tertiary di- or polyarylamines) contains about two or more units which are —$Ar^2(R^2)$—E;

X is chlorine or bromine;

m is a number of from about 0 to about 50; and n is a number of from about 1 to about 50.

* * * * *

UNITED STATES PATENT AND TRADEMARK OFFICE
CERTIFICATE OF CORRECTION

PATENT NO. : 5,929,194
DATED : July 27, 1999
INVENTOR(S) : Edmund P. Woo; Michael Inbasekaran; William R. Shiang; Gordon R. Roof It is certified that error appears in the above-identified patent and that said Letters Patent is hereby corrected as shown below:

Title Page,

Column 2, OTHER PUBLICATIONS,

Line 28, "PCS" should correctly read -- ACS --

Column 42,
Line 66, "$C_{20}$" should correctly read -- $C_{1-20}$ --

Column 43,
Line 67 "—$Ar^2$ ($R^2$-E" should correctly read -- $Ar^2$ ($R^2$) - E --

Signed and Sealed this

Thirty-first Day of July, 2001

Attest:

NICHOLAS P. GODICI

Attesting Officer     Acting Director of the United States Patent and Trademark Office